United States Patent
Fuergut et al.

(10) Patent No.: US 8,786,111 B2
(45) Date of Patent: Jul. 22, 2014

(54) SEMICONDUCTOR PACKAGES AND METHODS OF FORMATION THEREOF

(75) Inventors: Edward Fuergut, Dasing (DE);
Joachim Mahler, Regensburg (DE);
Khalil Hosseini, Weihmichl (DE);
Hans-Joerg Timme, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/471,291

(22) Filed: May 14, 2012

(65) Prior Publication Data

US 2013/0299848 A1    Nov. 14, 2013

(51) Int. Cl.
*H01L 23/29* (2006.01)

(52) U.S. Cl.
USPC ............. 257/790; 257/E51.02; 257/E33.059; 438/51; 438/106

(58) Field of Classification Search
USPC .............. 257/678, E23.116, 787, 790, 499, 257/E51.02, E33.059; 438/25, 51, 106, 113
See application file for complete search history.

(56) References Cited

U.S. PATENT DOCUMENTS

| | | | |
|---|---|---|---|
| 5,904,499 A | 5/1999 | Pace | |
| 5,986,338 A | 11/1999 | Nakajima | |
| 7,608,917 B2 | 10/2009 | Kajiwara et al. | |
| 7,622,733 B2 | 11/2009 | Fuergut et al. | |
| 7,674,654 B2 | 3/2010 | Brunnbauer et al. | |
| 7,799,614 B2 | 9/2010 | Otremba et al. | |
| 7,800,217 B2 | 9/2010 | Otremba et al. | |
| 7,919,852 B2 | 4/2011 | Yamada | |
| 7,936,048 B2 | 5/2011 | Otremba | |
| 7,955,901 B2 | 6/2011 | Ewe et al. | |
| 7,982,309 B2 | 7/2011 | Vervoort et al. | |
| 8,013,441 B2 | 9/2011 | Bauer et al. | |
| 2007/0076390 A1 | 4/2007 | Kroener et al. | |
| 2009/0072379 A1 | 3/2009 | Ewe et al. | |
| 2009/0096041 A1* | 4/2009 | Sakakibara et al. | 257/419 |
| 2009/0189264 A1 | 7/2009 | Yato et al. | |
| 2010/0297810 A1 | 11/2010 | Otremba et al. | |
| 2011/0062491 A1 | 3/2011 | Nakata | |
| 2011/0127653 A1* | 6/2011 | Pagaila et al. | 257/660 |
| 2011/0241198 A1 | 10/2011 | Azuma | |
| 2012/0208319 A1* | 8/2012 | Meyer et al. | 438/107 |
| 2012/0217634 A9* | 8/2012 | Shim et al. | 257/737 |
| 2012/0326300 A1* | 12/2012 | Feng et al. | 257/737 |

FOREIGN PATENT DOCUMENTS

| | | |
|---|---|---|
| DE | 10334576 A1 | 3/2005 |
| DE | 102006025671 A1 | 12/2007 |
| DE | 102008008920 A1 | 8/2008 |
| DE | 102008045338 A1 | 4/2009 |
| DE | 102008062498 A1 | 7/2009 |

* cited by examiner

*Primary Examiner* — Jarrett Stark
*Assistant Examiner* — Shahed Ahmed
(74) *Attorney, Agent, or Firm* — Slater & Matsil, L.L.P.

(57) ABSTRACT

In one embodiment, a semiconductor package includes a vertical semiconductor chip having a first major surface on one side of the vertical semiconductor chip and a second major surface on an opposite side of the vertical semiconductor chip. The first major surface includes a first contact region and the second major surface includes a second contact region. The vertical semiconductor chip is configured to regulate flow of current from the first contact region to the second contact region along a current flow direction. A back side conductor is disposed at the second contact region of the second major surface. The semiconductor package further includes a first encapsulant in which the vertical semiconductor chip and the back side conductor are disposed.

30 Claims, 22 Drawing Sheets

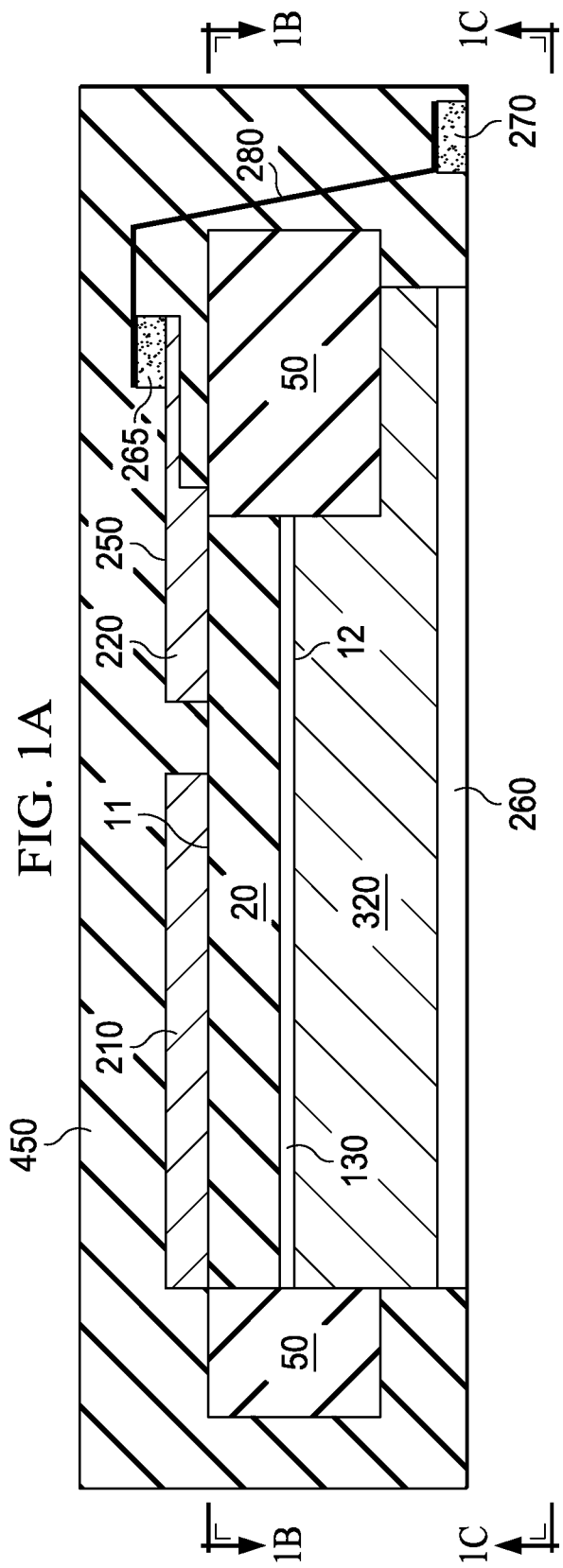

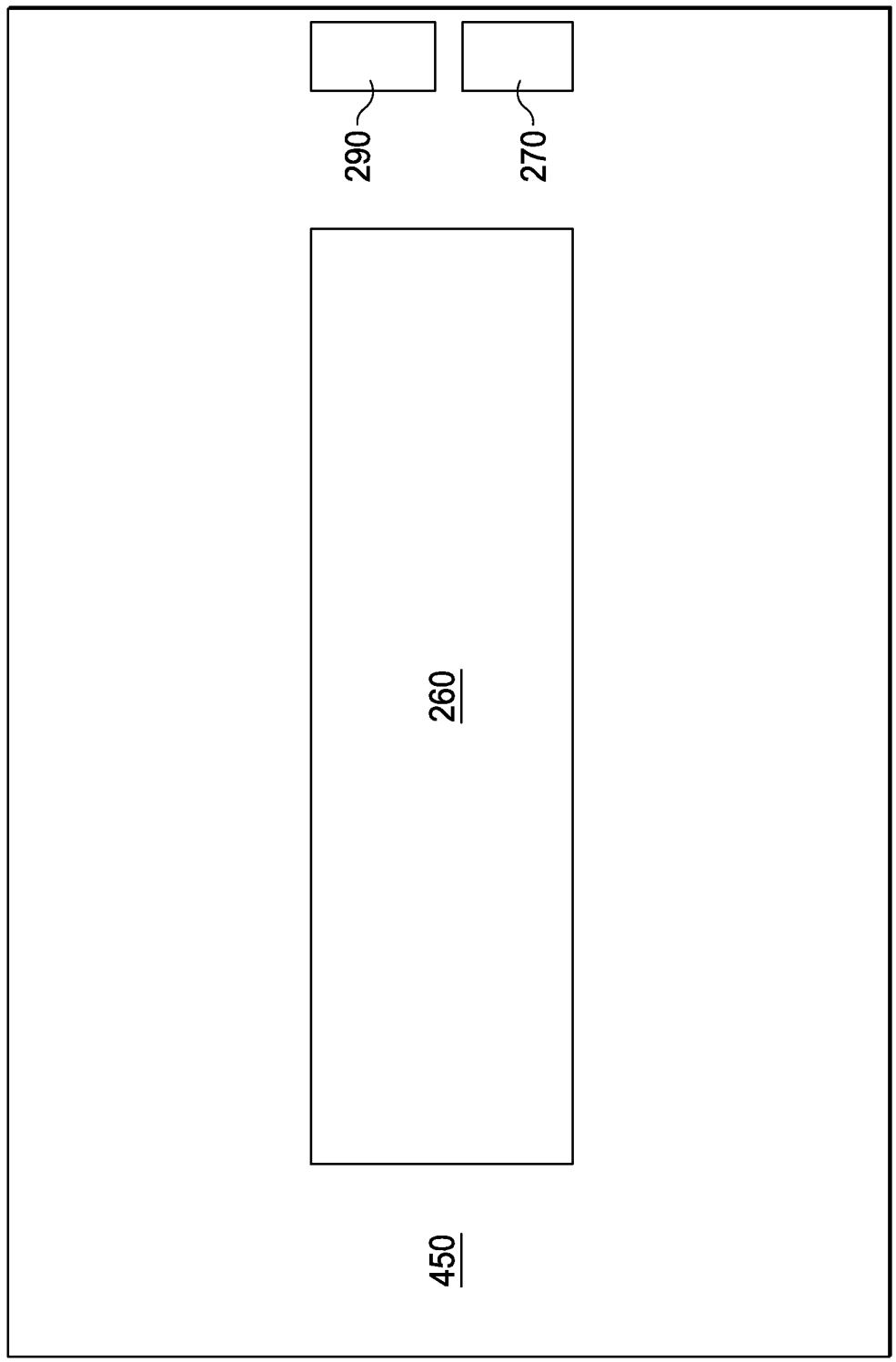

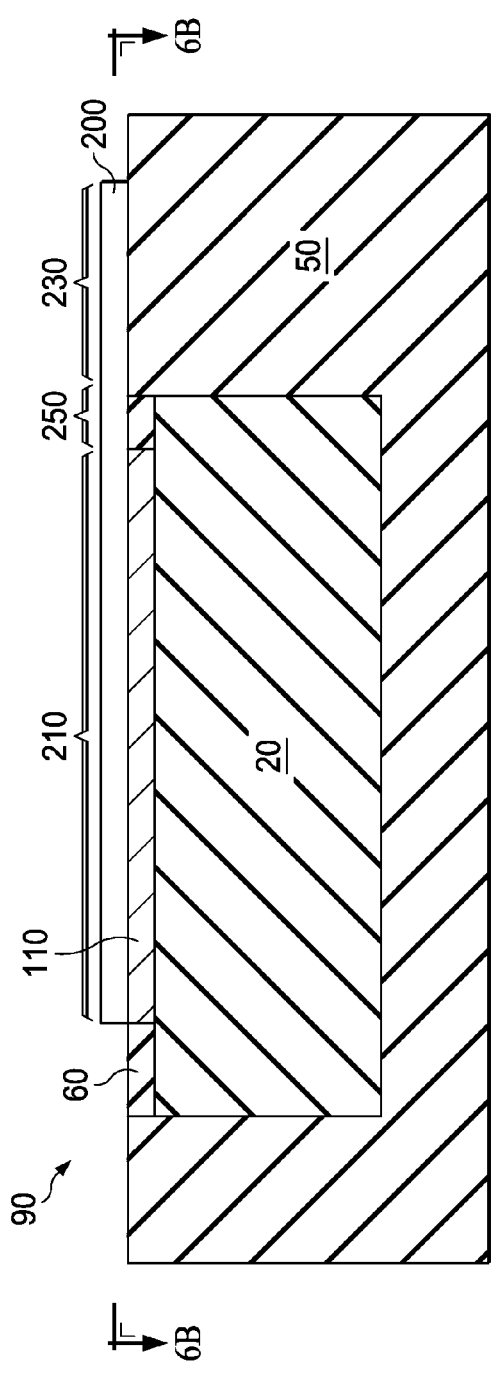
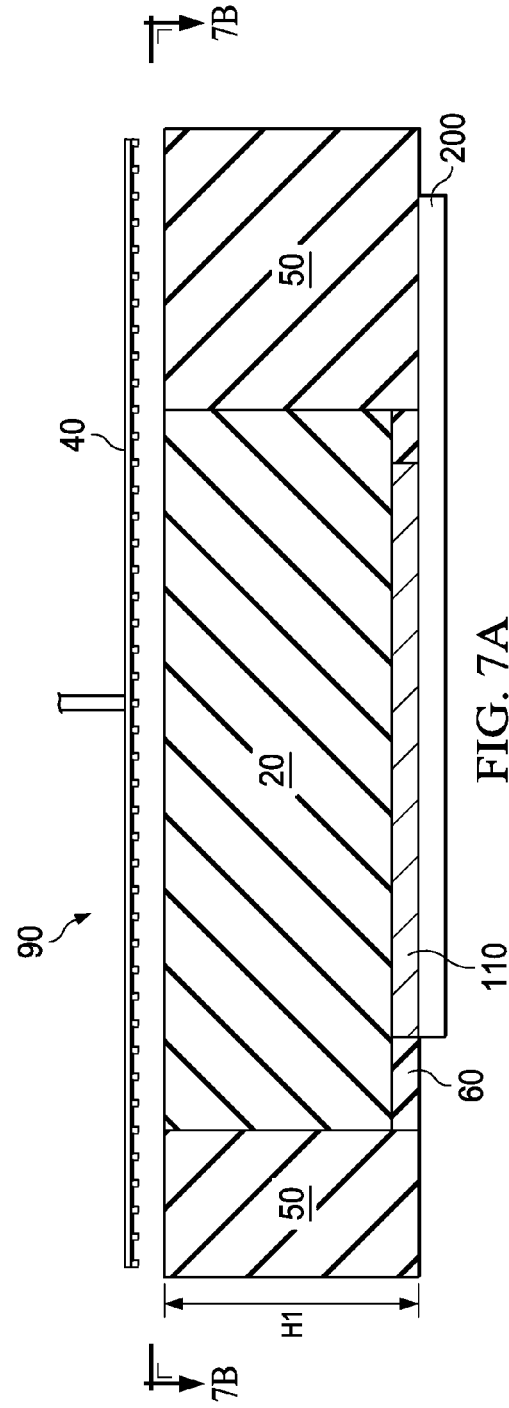
FIG. 6A
FIG. 7A

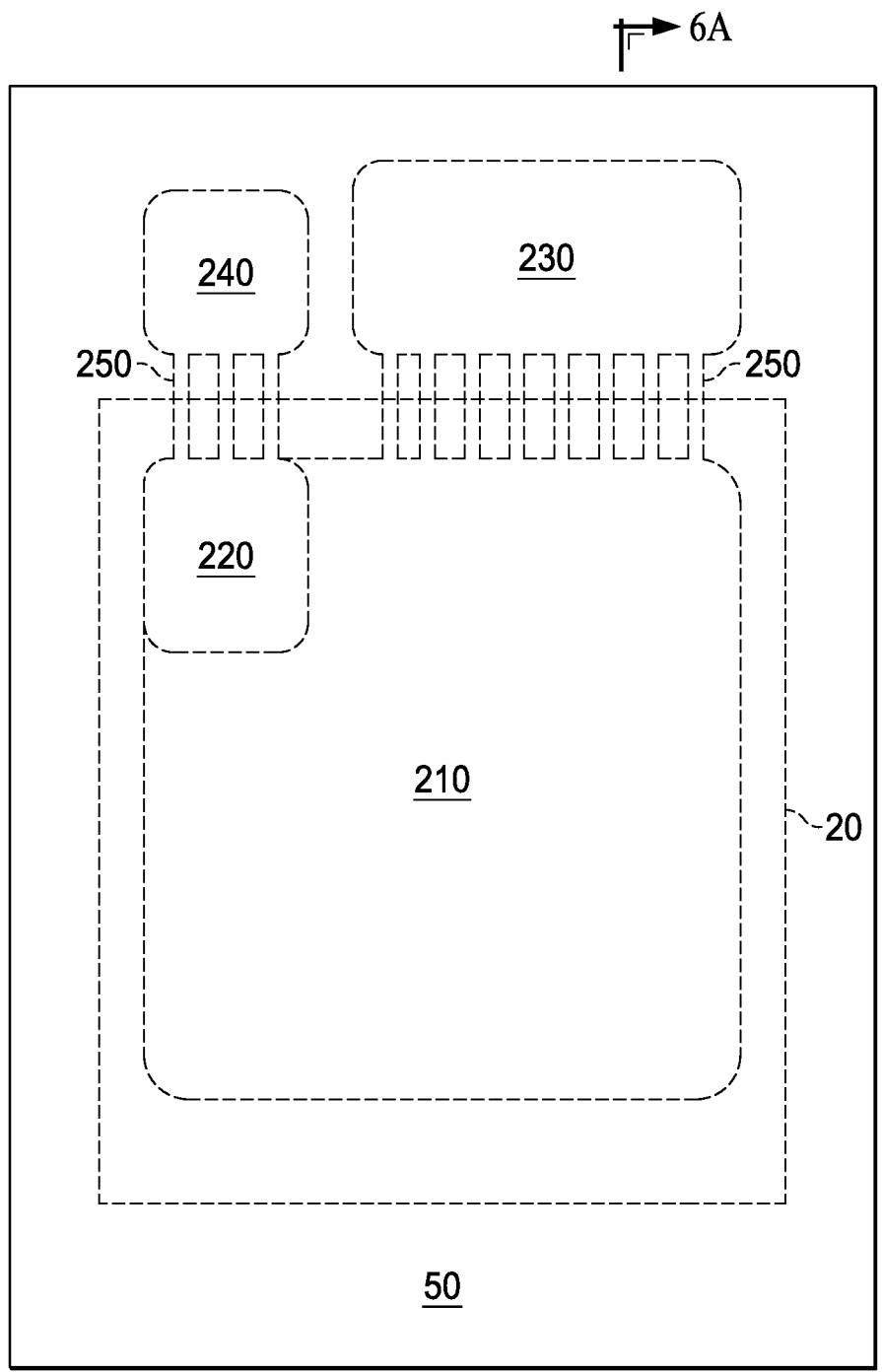

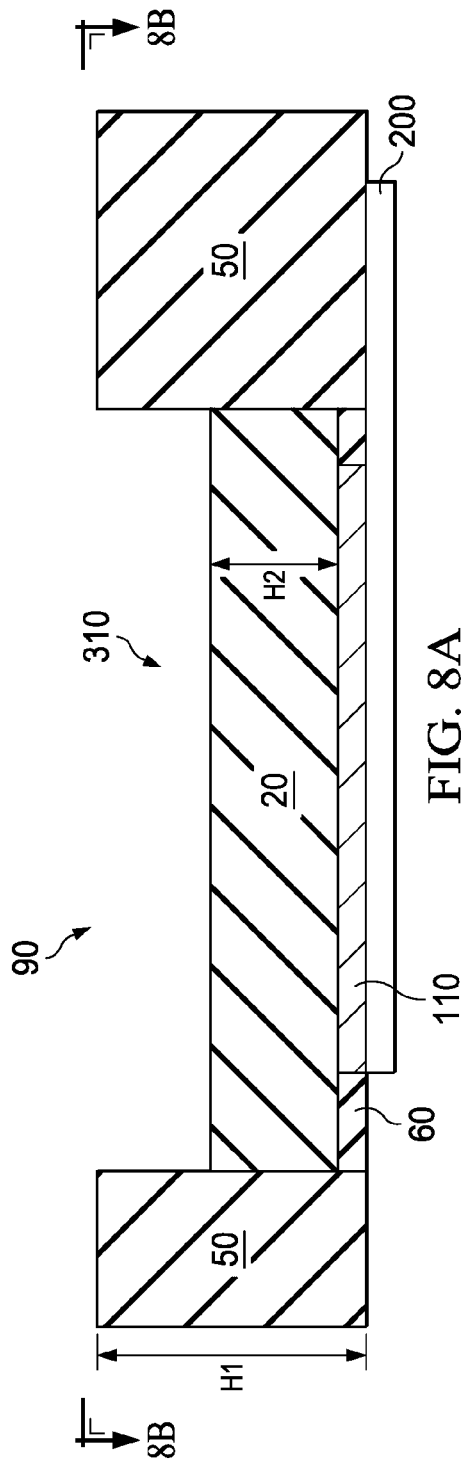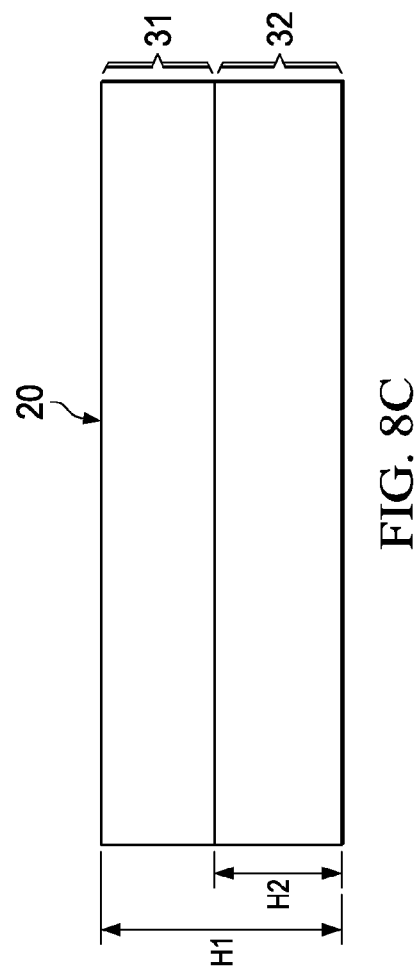
FIG. 8A
FIG. 8C

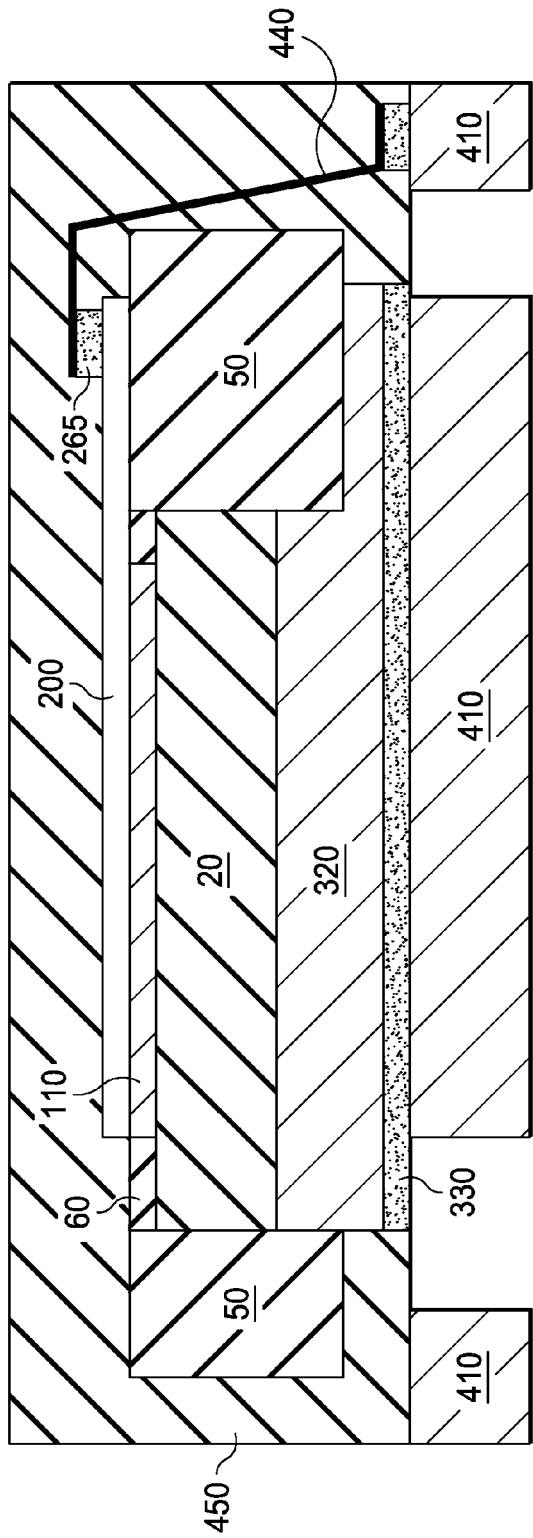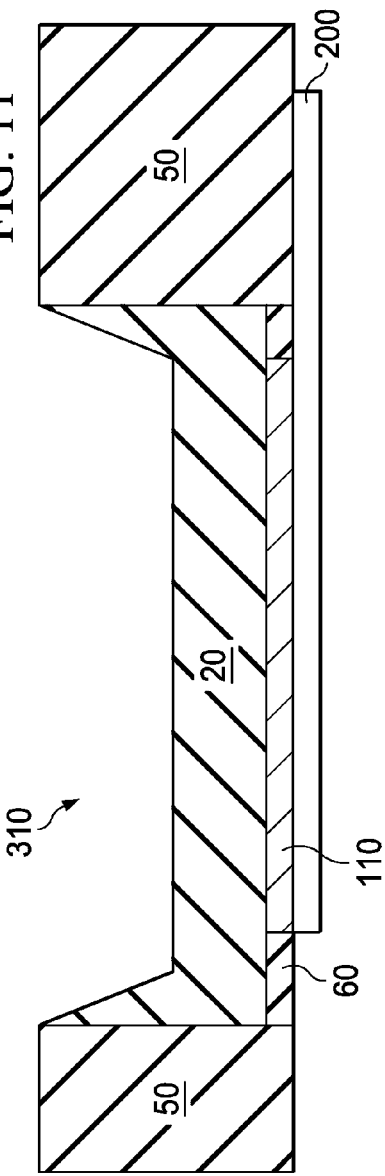

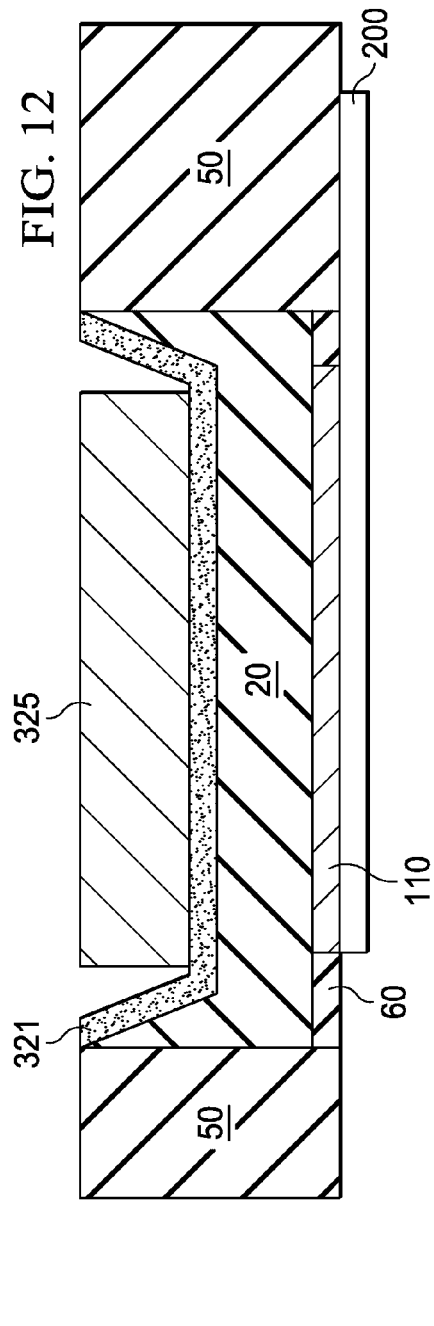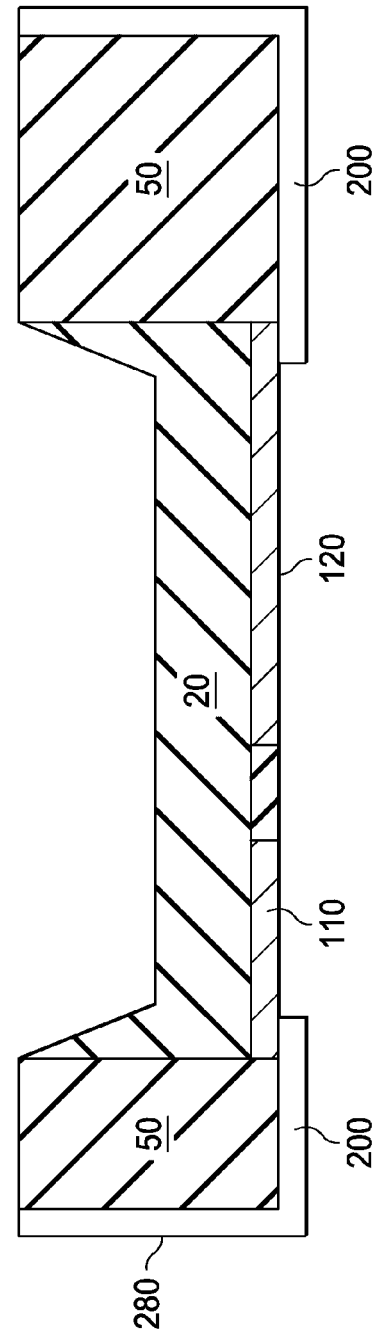

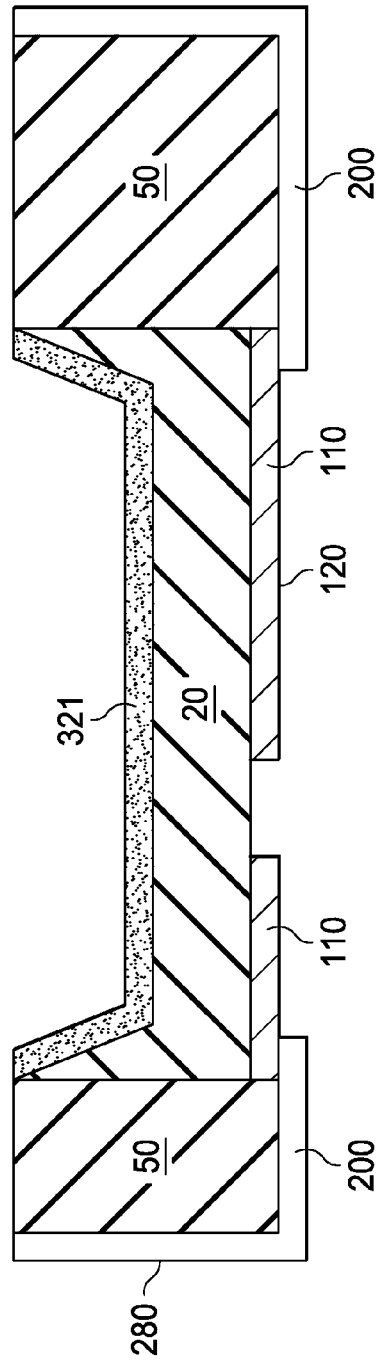
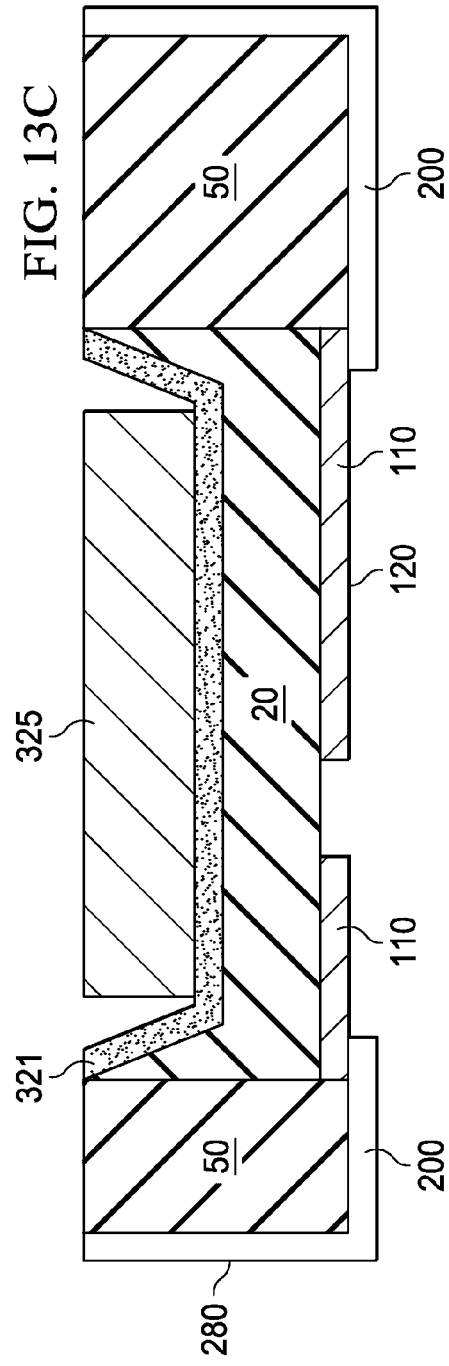

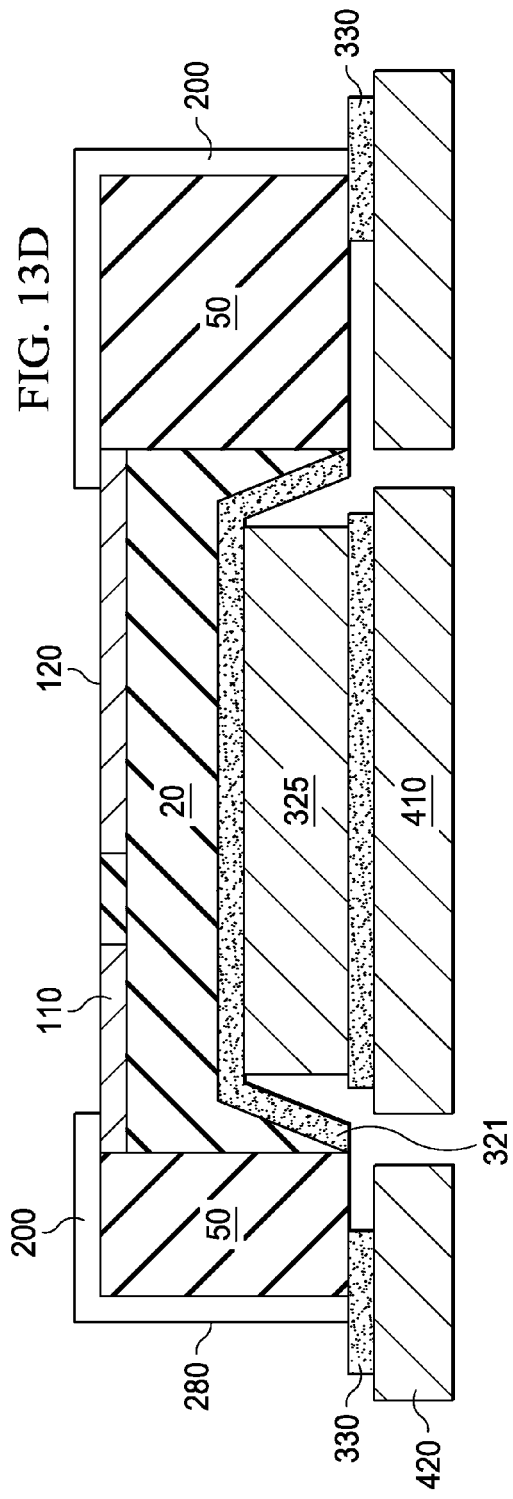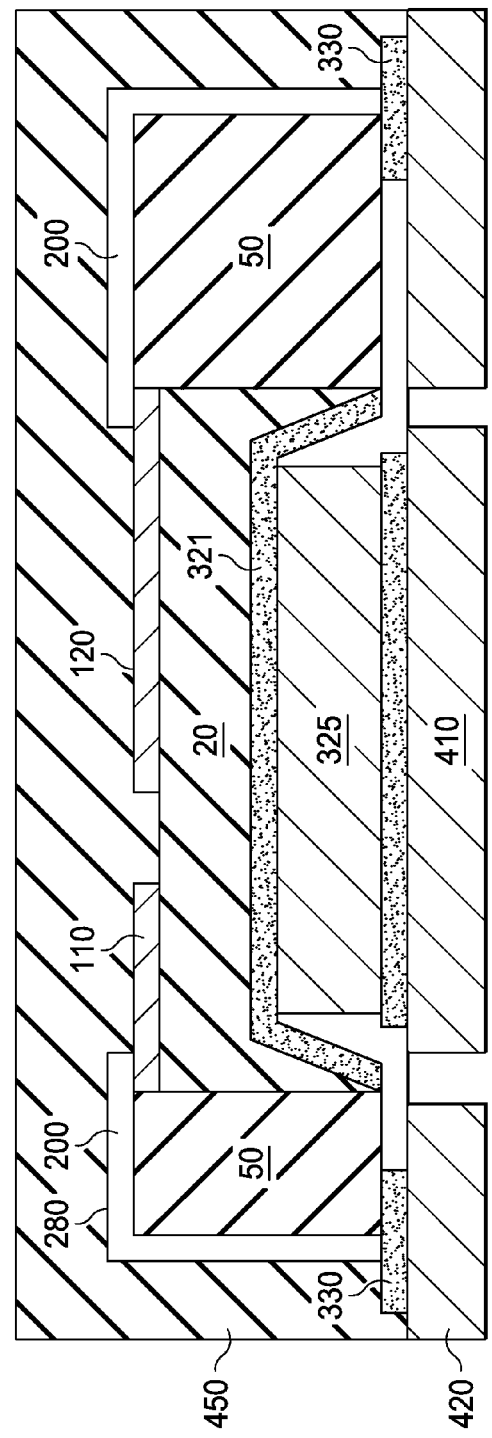

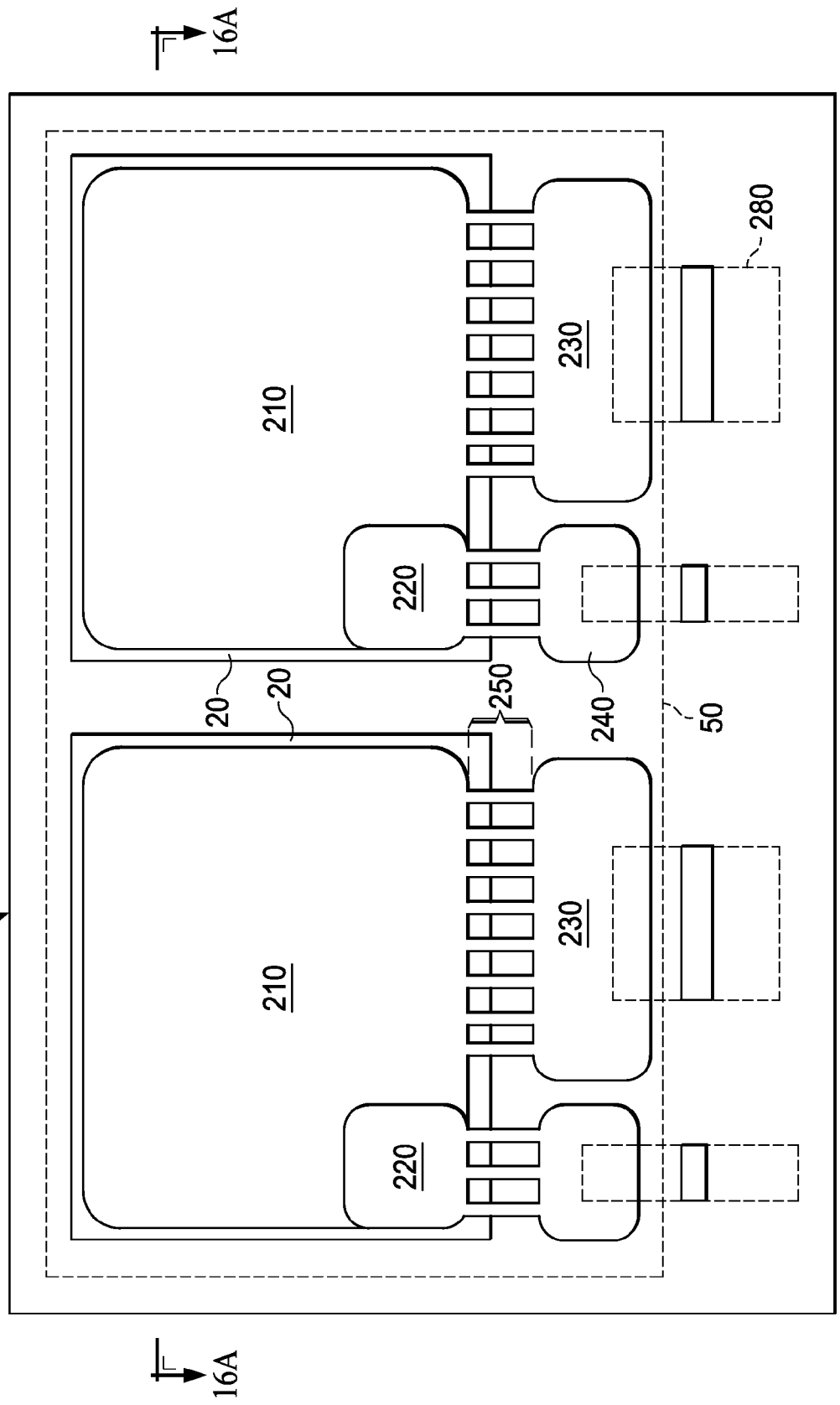

SEMICONDUCTOR PACKAGES AND METHODS OF FORMATION THEREOF

TECHNICAL FIELD

The present invention relates generally to semiconductor devices, and more particularly to semiconductor packages and methods of formation thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

The semiconductor devices are typically packaged within a ceramic or a plastic body to protect the semiconductor devices from physical damage or corrosion. The packaging also supports the electrical contacts required to connect a semiconductor device, also referred to as a die or a chip, to other devices external to the packaging. Many different types of packaging are available depending on the type of semiconductor device and the intended use of the semiconductor device being packaged. Typical packaging features, such as dimensions of the package, pin count, etc., may comply with open standards from Joint Electron Devices Engineering Council (JEDEC), among others. Packaging may also be referred as semiconductor device assembly or simply assembly.

Packaging may be a cost intensive process because of the complexity of connecting multiple electrical connections to external pads while protecting these electrical connections and the underlying chip or chips.

SUMMARY OF THE INVENTION

These and other problems are generally solved or circumvented, and technical advantages are generally achieved, by the illustrative embodiments of the present invention discussed below.

In accordance with an embodiment of the present invention, a semiconductor package comprises a vertical semiconductor chip having a first major surface on one side of the vertical semiconductor chip and a second major surface on an opposite side of the vertical semiconductor chip. The first major surface includes a first contact region and the second major surface includes a second contact region. The vertical semiconductor chip is configured to regulate flow of current from the first contact region to the second contact region along a current flow direction. A back side conductor is disposed at the second contact region of the second major surface. The semiconductor package further comprises a first encapsulant in which the vertical semiconductor chip and the back side conductor are disposed.

In accordance with an embodiment of the present invention, a method of forming a semiconductor package comprises placing a vertical semiconductor chip on a carrier. The vertical semiconductor chip has an active region on a front side of the vertical semiconductor chip and an active region on a back side of the vertical semiconductor chip. The front side of the vertical semiconductor chip faces the carrier. The vertical semiconductor chip is configured to regulate current flow from the front side of the vertical semiconductor chip to the back side of the vertical semiconductor chip. The method further comprises forming a reconstituted wafer by applying a first encapsulant on the vertical semiconductor chip and the carrier. The reconstituted wafer has a first major surface that is coplanar with the front side of the vertical semiconductor chip. The method further comprises separating the reconstituted wafer from the carrier, thereby exposing the first major surface, and thinning the reconstituted wafer from a side opposite the first major surface to form a second major surface of the reconstituted wafer. The vertical semiconductor chip is selectively thinned relative to the first encapsulant from the second major surface so as to expose a surface of the active region on the back side of the at least one vertical semiconductor chip. A back side conductor is formed on an exposed surface of the active region on the back side of the vertical semiconductor chip. The method includes encapsulating the first encapsulant, the vertical semiconductor chip, and the back side conductor with a second encapsulant.

The foregoing has broadly outlined various features of an embodiment of the present invention in order that the below-presented detailed description of the invention may be better understood. Additional features and advantages of the various embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the claims recited below.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a semiconductor package in accordance with an embodiment of the invention, wherein FIG. 1A illustrates a cross-sectional view, FIG. 1B illustrates a top sectional view, and FIG. 1C illustrates a bottom view;

FIG. 5, which includes FIGS. 5A-5C, illustrates a magnified view of the semiconductor package during fabrication showing front side metallization in accordance with an embodiment of the invention, wherein FIGS. 5A and 5C illustrate cross-sectional views and FIG. 5B illustrates a top sectional view;

FIG. 6, which includes FIGS. 6A and 6B, illustrates a magnified view of the semiconductor package, during fabrication, after formation of front side redistribution layer in accordance with an embodiment of the invention, wherein FIG. 6A illustrates a cross-sectional view and FIG. 6B illustrates a top sectional view;

FIG. 7, which includes FIGS. 7A and 7B, illustrates a magnified view of the semiconductor package, during fabrication, after thinning the reconstituted wafer in accordance with an embodiment of the invention, wherein FIG. 7A illustrates a cross-sectional view and FIG. 7B illustrates a top sectional view;

FIG. 8, which includes FIGS. 8A-8C, illustrates a magnified view of the semiconductor package, during fabrication, after further thinning the vertical semiconductor chip in accordance with an embodiment of the invention, wherein FIG. 8A illustrates a cross-sectional view and FIG. 8B illustrates a top sectional view, and wherein FIG. 8C illustrates an alternative embodiment showing a further magnified cross-sectional view;

FIG. 9, which includes FIGS. 9A and 9B, illustrates a magnified view of the semiconductor package, during fabrication, after forming a back side conductor under the vertical semiconductor chip in accordance with an embodiment of the invention, wherein FIG. 9A illustrates a cross-sectional view and FIG. 9B illustrates a top sectional view;

FIG. 10, which includes FIGS. 10A and 10B, illustrates leadframe semiconductor packages formed in accordance with embodiments of the invention;

FIGS. 11-12 illustrate an alternative structural embodiment of a semiconductor package and a method of forming;

FIG. 13, which includes FIGS. 13A-13E, illustrates an alternative embodiment in which the front and back side redistribution layers are formed after the thinning process;

FIG. 14, which includes

FIG. 16, which includes FIGS. 16A and 16B, illustrates a semiconductor package having more than one vertical semiconductor chips in accordance with an embodiment of the invention;

FIG. 17, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of contexts. The specific embodiments discussed are merely illustrative of a particular way to make and use the invention, and do not limit the scope of the invention.

Power semiconductor dies have special requirements (e.g., due to the high voltages and high heat generation) and require good thermal management. Consequently, packages for power semiconductor devices have enhanced performance requirements while being very sensitive to production costs. As will be described below, various embodiments of the present invention enable formation of packages for power semiconductor packages with improved performance at low costs.

Embodiments of the invention have many advantages over the conventional packages for vertical semiconductor devices. For example, embodiments of the present invention enable formation of ultra-thin chips, e.g, chips thinner than about 60 µm, without mechanical stabilization issues. Further mechanical and thermo-mechanical stresses are dramatically lowered. Embodiments of the present invention advantageously decouple stress between the ultra-thin chip and the housing/encapsulant. Embodiments of the present invention provide methods to form contacts and rewiring (e.g., redistribution lines) to ultra-thin chips without mechanical and other issues. Embodiments of the present invention lower thermal resistance and electrical resistance, thus improving the performance of the device. Embodiments of the invention reduce the number of manufacturing process steps, thereby reducing the costs associated with packaging. Similarly, many packages are produced in parallel in various embodiments, which further reduces production costs.

A structural embodiment of the present invention will be described using FIG. 1. Further structural embodiments will be described using FIGS. 10, 12, 13, 14, 15, 16, 17, and 18. A method of forming the semiconductor package will be described using FIGS. 2-10. Further embodiments of fabricating the package will be described using FIGS. 11-12, FIG. 13, and FIG. 14.

Figure 1B:
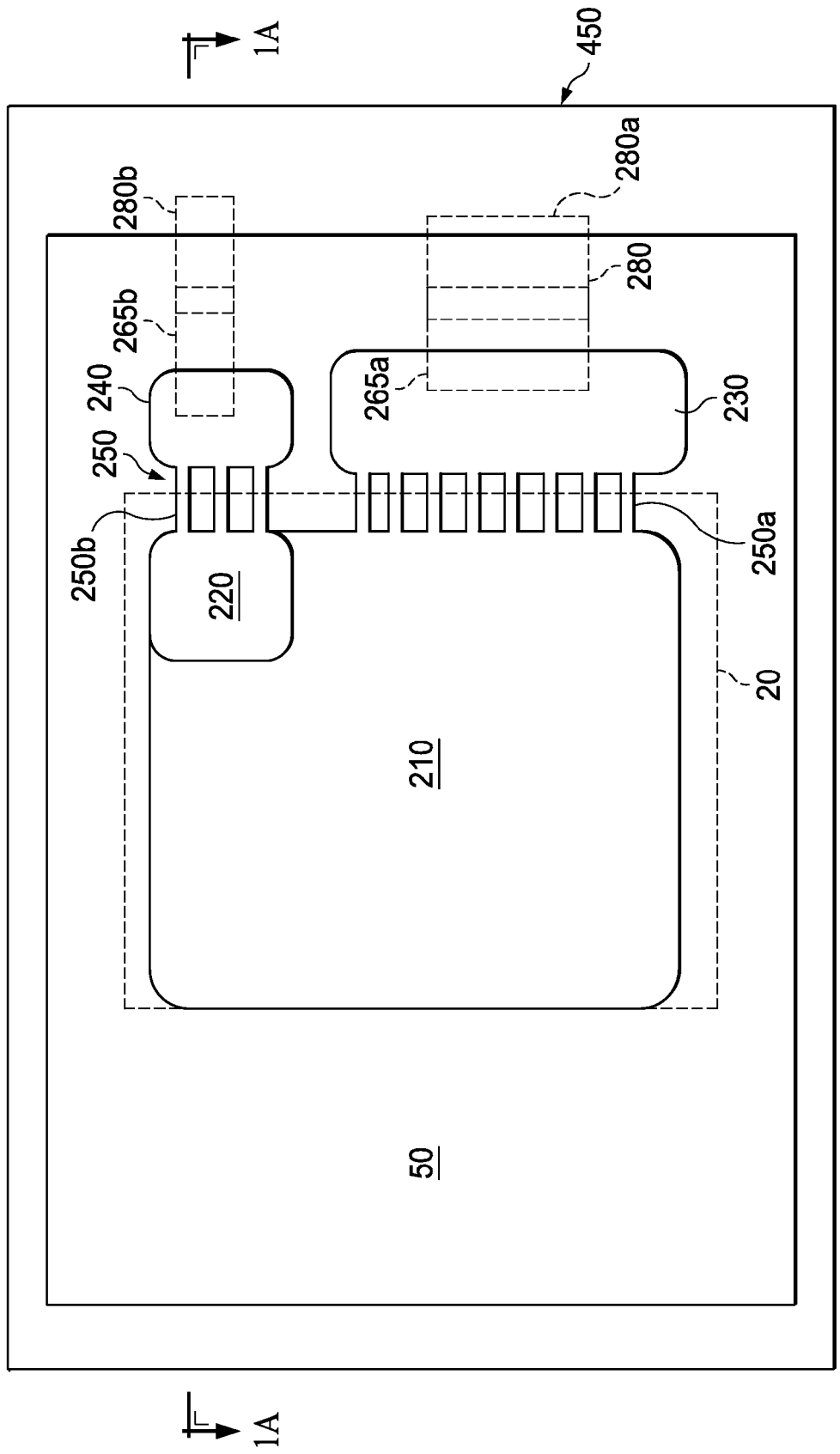

FIG. 1, which includes FIGS. 1A-1C, illustrates a semiconductor package in accordance with an embodiment of the present invention, wherein FIG. 1A illustrates a cross-sectional view, FIG. 1B illustrates a top sectional view, and FIG. 1C illustrates a bottom view.

Referring to FIG. 1A, a vertical semiconductor chip 20 is disposed in an encapsulant 50. In various embodiments, the vertical semiconductor chip 20 is a vertical semiconductor device due to the vertical flow of current, e.g., from a top surface 11 to a bottom surface 12. Accordingly, the vertical semiconductor chip 20 has contact regions on the top surface 11 and on the bottom surface 12.

In various embodiments, the vertical semiconductor chip 20 may be formed on a silicon substrate. Alternatively, in other embodiments, the vertical semiconductor chip 20 may be a device formed on silicon carbide (SiC). In one embodiment, the vertical semiconductor chip 20 is a device formed at least partially on gallium nitride (GaN).

In various embodiments, the vertical semiconductor chip 20 comprises a power semiconductor device, which may be a discrete device in one embodiment. In one embodiment, the vertical semiconductor chip 20 is a two terminal device such as a PIN diode or a Schottky diode. In one or more embodiments, the vertical semiconductor chip 20 is a three terminal device such as a power metal insulator semiconductor field effect transistor (MISFET), a junction field effect transistor (JFET), bipolar junction transistor (BJT), an insulated gate bipolar transistor (IGBT), or a thyristor.

In various embodiments, the vertical semiconductor chip 20 is configured to operate at about 20 V to about 1000 V. In one embodiment, the vertical semiconductor chip 20 is configured to operate at about 20 V to about 100 V. In another embodiment, the vertical semiconductor chip 20 is configured to operate at about 100 V to about 500 V. In yet another embodiment, the vertical semiconductor chip 20 is configured to operate at about 500 V to about 1000 V. In one embodiment, the vertical semiconductor chip 20 is an NPN transistor. In another embodiment, the vertical semiconductor chip 20 is a PNP transistor. In yet another embodiment, the vertical semiconductor chip 20 is an n-channel MISFET. In a further embodiment, the vertical semiconductor chip 20 is a p-channel MISFET. In one or more embodiments, the vertical semiconductor chip 20 may comprise a plurality of devices such as a vertical MISFET and a diode, or alternatively two MISFET devices separated by an isolation region.

The thickness of the vertical semiconductor chip 20 from the top surface 11 to the bottom surface 12 may be less than 50 μm in various embodiments. The thickness of the vertical semiconductor chip 20 from the top surface 11 to the bottom surface 12 may be less than 20 μm in various embodiments. The thickness of the vertical semiconductor chip 20 from the top surface 11 to the bottom surface 12 may be less than 10 μm in various embodiments.

The thickness of the vertical semiconductor chip 20 from the top surface 11 to the bottom surface 12 may be about 5 μm to about 50 μm in various embodiments. The thickness of the vertical semiconductor chip 20 from the top surface 11 to the bottom surface 12 may be about 1 μm to about 10 μm in one embodiment. The thickness of the vertical semiconductor chip 20 from the top surface 11 to the bottom surface 12 may be about 0.5 μm to about 5 μm in another embodiment. The thickness of the vertical semiconductor chip 20 from the top surface 11 to the bottom surface 12 may be about 1 μm to about 2.5 μm in yet another embodiment. A thickness less than 10 μm may be advantageous to minimize electrical resistivity and to improve thermal conductivity so as to facilitate improved electrical performance while efficiently removing heat generated within the vertical semiconductor chip 20 during operation.

In various embodiments, the encapsulant 50 comprises a dielectric material and may comprise a mold compound in one embodiment. In other embodiments, the encapsulant 50 may comprise one or more of a polymer, a copolymer, a biopolymer, a fiber impregnated polymer (e.g., carbon or glass fibers in a resin), a particle filled polymer, and other organic materials. In one or more embodiments, the encapsulant 50 comprises a sealant not formed using a mold compound, and materials such as epoxy resins and/or silicones. In various embodiments, the encapsulant 50 may be made of any appropriate duroplastic, thermoplastic, a thermosetting material, or a laminate. The material of the encapsulant 50 may include filler materials in some embodiments. In one embodiment, the encapsulant 50 may comprise epoxy material and a fill material comprising small particles of glass or other electrically insulating mineral filler materials like alumina or organic fill materials.

In one or more embodiments, the vertical semiconductor chip 20 is a discrete three terminal power semiconductor device. In one embodiment, the vertical semiconductor chip 20 is a three terminal transistor having a source, a gate, and a drain. In one embodiment, the source gate are formed adjacent the top surface 11 while the drain is formed adjacent the back surface 12.

In the embodiment where the source and gate are formed adjacent the top surface 11 and the drain is formed adjacent the back surface 12, the top surface 11 has a source contact region 110 and a gate contact region 120 while the back surface 13 has a drain contact region 130. The source contact region 110, the gate contact region 120, and the drain contact region 130 may comprise a silicide region in one embodiment.

As illustrated in FIGS. 1A and 1B, a gate contact 220 is coupled to the gate (through gate contact region 120) and a source contact 210 coupled to the source (through the source contact region 110) are disposed over the top surface of the vertical semiconductor chip 20. Similarly, a back side contact 320 is disposed on a drain of the vertical semiconductor chip 20. In various embodiments, the gate contact 220, the source contact 210, and the back side contact 320 may be coupled through silicide regions disposed on the top and bottom surfaces of the vertical semiconductor chip 20.

As illustrated in FIG. 1B, the source contact 210 is coupled through a plurality of conductive lines 250a to a source pad 230 and the gate contact 220 is coupled through a plurality of conductive lines 250b to a gate pad 240. Accordingly, the semiconductor package is a fan-out package because the package size is larger than the size of the vertical semiconductor chip 20. Advantageously, placing the pads away from the source and the gate contacts 210 and 220 avoids damage to the vertical semiconductor chip 20, for example, during testing.

As further illustrated in FIGS. 1A and 1B, interconnects 280a and 280b may couple one or more front side contact pads with one or more contact pads on the back side. In or more embodiments, the interconnects 280a and 280b may be attached using intermediate layer 265a and 265b, respectively, which may be a layer for soldering, or a conductive adhesive paste. Alternatively, a film or a tape may be used. In various embodiments, the interconnects 280a and 280b may be any suitable type of interconnection and may include clamps, wire bonds, clip, strip, ribbon, galvanic strips, and others.

As illustrated in FIGS. 1A and 1C, the encapsulant 50 is disposed in an outer encapsulant 450. In one embodiment, the encapsulant 50 and the outer encapsulant 450 comprise the same material. In alternative embodiments, the encapsulant 50 and the outer encapsulant 450 comprise different materials. In various embodiments, the outer encapsulant 450 comprises a dielectric material and may comprise a mold compound in one embodiment. In other embodiments, the outer encapsulant 450 may comprise one or more of a polymer, a copolymer, a biopolymer, a fiber impregnated polymer (e.g., carbon or glass fibers in a resin), a particle filled polymer, and other organic materials. In one or more embodiments, the outer encapsulant 450 comprises a sealant not formed using a mold compound, and materials such as epoxy resins and/or silicones. In various embodiments, the outer encapsulant 450 may be made of any appropriate duroplastic, thermoplastic, a thermosetting material, or a laminate. The material of the outer encapsulant 450 may include filler materials in some embodiments. In one embodiment, the encapsulant 50 may comprise epoxy material and a fill material comprising small particles of glass or other electrically insulating mineral filler materials like alumina or organic fill materials. In various embodiments, even if the encapsulant 50 and the outer encapsulant 450 comprise the same material, they have a distinct interface because of being formed in different process steps.

Referring to FIG. 1C, a surface of the semiconductor package may comprise pads or leads for contacting the devices on the package. As illustrated in the bottom view in FIG. 1C, a solderable drain pad 260 may be formed under the back side contact 320. A source input/output (I/O) 290 is formed on the back side of the package and is coupled to the source pad 230. Similarly, a gate I/O 270 is formed on the back side of the package and couples to the gate pad 240 (see also FIG. 1A).

FIGS. 2-10 illustrate a semiconductor package during various stages of processing in accordance with embodiments of the invention.

Figure 2:
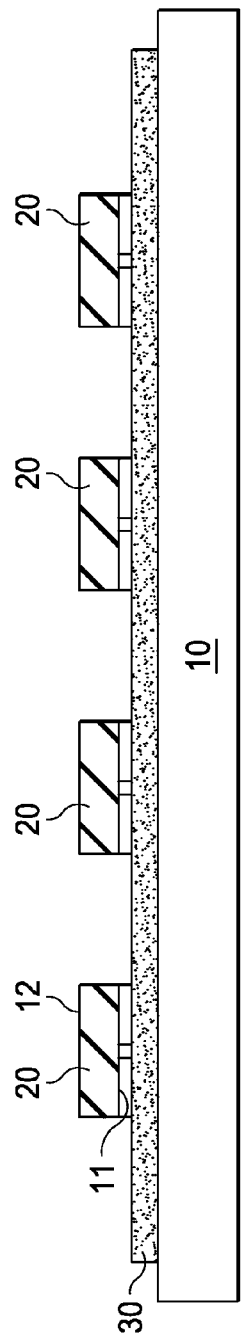
FIG. 2 illustrates a semiconductor package during fabrication after the placement of singulated dies over a carrier in accordance with an embodiment of the invention.

FIG. 2 illustrates a semiconductor package, during fabrication, after placing singulated dies over a carrier in accordance with an embodiment of the invention.

Referring to FIG. 2, a plurality of vertical semiconductor chips 20 are placed over a carrier 10. In various embodiments, the surface of the plurality of vertical semiconductor chips 20 having active regions is placed over the carrier 10 as illustrated in FIG. 2.

The plurality of vertical semiconductor chips 20 may be formed using conventional processing, for example, within a wafer, which is diced to form the plurality of vertical semiconductor chips 20. As described above, the plurality of vertical semiconductor chips 20 may be formed on a silicon substrate such as a bulk silicon substrate or a silicon on insulator (SOI) substrate. Alternatively, the vertical semiconductor chip 20 may be a device formed on silicon carbide (SiC). Embodiments of the invention may also include devices formed on compound semiconductor substrates and may include devices on hetero-epitaxial substrates. In one embodiment, the vertical semiconductor chip 20 is a device formed at least partially on gallium nitride (GaN), which may be a GaN on sapphire or silicon substrate.

Next, the plurality of vertical semiconductor chips 20 is attached to the carrier 10, which provides mechanical support and stability during processing. In various embodiments, the carrier 10 may be a plate made of a rigid material, for example, a metal such as nickel, steel, or stainless steel, a laminate, a film, or a material stack. The carrier 10 may have at least one flat surface over which the plurality of vertical semiconductor chips 20 may be placed. In one or more embodiments, the carrier 10 may be round or square-shaped although in various embodiments the carrier 10 may be any suitable shape. The carrier 10 may have any appropriate size in various embodiments. In some embodiments, the carrier 10 may include an adhesive tape, for example, a double sided sticky tape laminated onto the carrier 10. The carrier 10 may comprise a frame, which is an annular structure (ring shaped) with an adhesive foil in one embodiment. The adhesive foil may be supported along the outer edges by the frame in one or more embodiments.

The plurality of vertical semiconductor chips 20 may be attached using an adhesive layer 30 in various embodiments. In various embodiments, the adhesive layer 30 may comprise glue or other adhesive type material. In various embodiments, the adhesive layer 30 may be thin, for example, less than about 100 μm in one embodiment and between 1 μm to about 50 μm in another embodiment.

In various embodiments, the plurality of vertical semiconductor chips 20 may comprise power chips, which, for example, draw large currents (e.g., greater than 30 amperes). In various embodiments, the plurality of vertical semiconductor chips 20 may comprise discrete vertical devices such as a two or a three terminal power device. Examples of the vertical semiconductor chips 20 include PIN or Schottky diodes, MISFET, JFET, BJT, IGBT, or thyristor.

Figure 3:
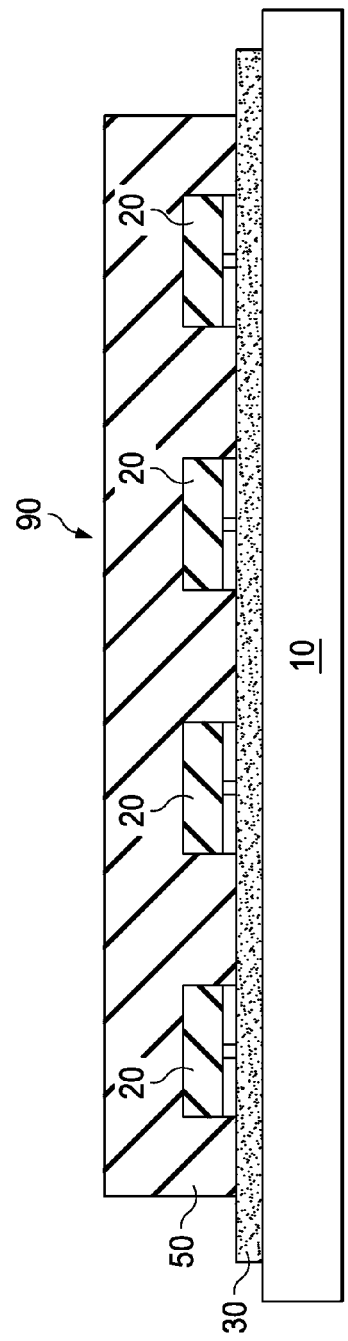
FIG. 3 illustrates the semiconductor package during fabrication after forming a reconstituted wafer in accordance with an embodiment of the invention.

FIG. 3 illustrates the semiconductor package during fabrication after forming a reconstituted wafer in accordance with an embodiment of the invention.

As illustrated in FIG. 3, an encapsulant 50 is applied over the plurality of vertical semiconductor chips 20 and partially encloses the plurality of vertical semiconductor chips 20. In one embodiment, the encapsulant 50 is applied using a compression molding process. In compression molding, the encapsulant 50 may be placed into a molding cavity, then the molding cavity is closed to compress the encapsulant 50. Compression molding may be used when a single pattern is being molded. In an alternative embodiment, the encapsulant 50 is applied using a transfer molding process. In other embodiments, the encapsulant 50 may be applied using injection molding, granulate molding, powder molding, or liquid molding. Alternatively, the encapsulant 50 may be applied using printing processes such as stencil or screen printing.

In various embodiments, the encapsulant 50 comprises a dielectric material and may comprise a mold compound in one embodiment. In other embodiments, the encapsulant 50 may comprise one or more of a polymer, a copolymer, a biopolymer, a fiber impregnated polymer (e.g., carbon or glass fibers in a resin), a particle filled polymer, and other organic materials. In one or more embodiments, the encapsulant 50 comprises a sealant not formed using a mold compound, and materials such as epoxy resins and/or silicones. In various embodiments, the encapsulant 50 may be made of any appropriate duroplastic, thermoplastic, a thermosetting material, or a laminate. The material of the encapsulant 50 may include filler materials in some embodiments. In one embodiment, the encapsulant 50 may comprise epoxy material and a fill material comprising small particles of glass or other electrically insulating mineral filler materials like alumina or organic fill materials. The encapsulant 50 may be cured, i.e., subjected to a thermal process to harden thus forming a hermetic seal protecting the plurality of semiconductor chips 20. The curing process hardens the encapsulant 50 thereby forming a single substrate holding the plurality of vertical semiconductor chips 20. Such a substrate is referred as a reconstituted wafer 90.

Figure 4:
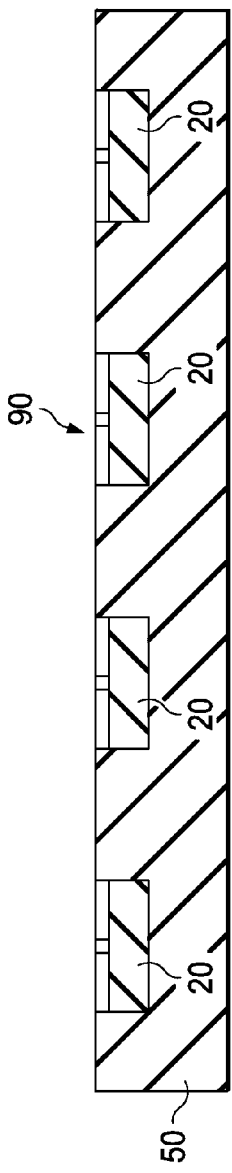
FIG. 4 illustrates the semiconductor package during fabrication after separating the reconstituted wafer from the carrier in accordance with an embodiment of the invention.

FIG. 4 illustrates the semiconductor package, during fabrication, after separating the reconstituted wafer from the carrier in accordance with an embodiment of the invention.

Referring to FIG. 4, the carrier 10 is removed to separate the reconstituted wafer 90 or artificial wafer. The encapsulant 50 embedded with the plurality of vertical semiconductor chips 20 provides mechanical and thermal stability during subsequent processing. Removing the carrier 10 also exposes the front surface of the semiconductor chip 20. The reconstituted wafer 90 may be subjected to temperatures as high as 300 C depending on the thermal stability of the encapsulant 50 in various embodiments.

Figure 5A:
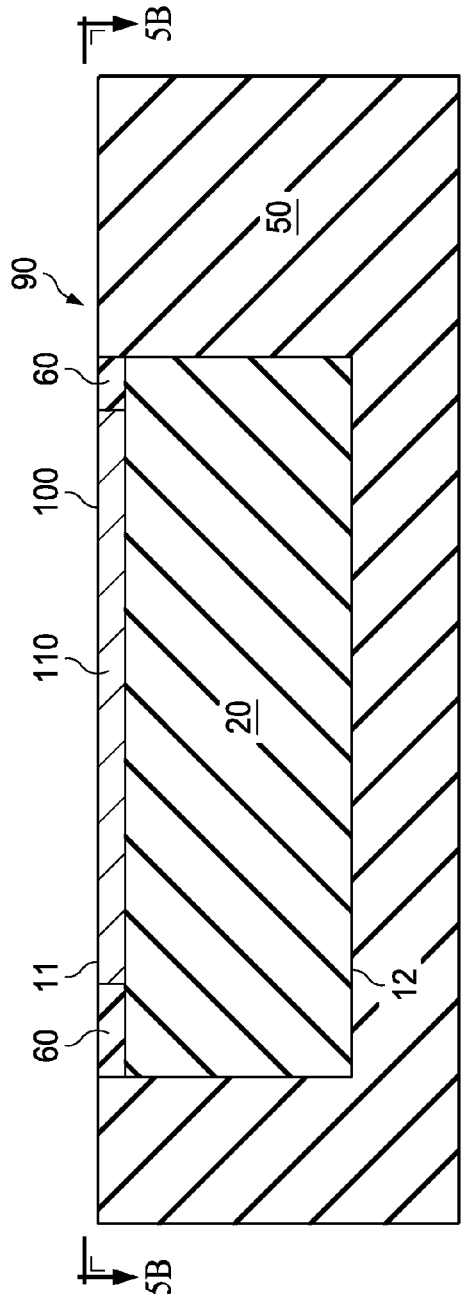
Figure 5C:
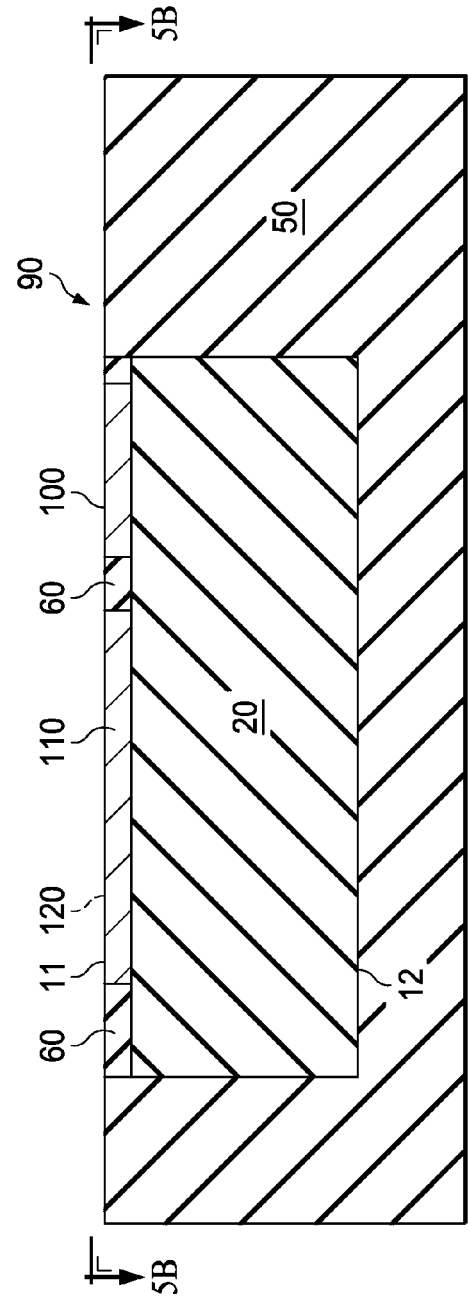
Figure 5B:
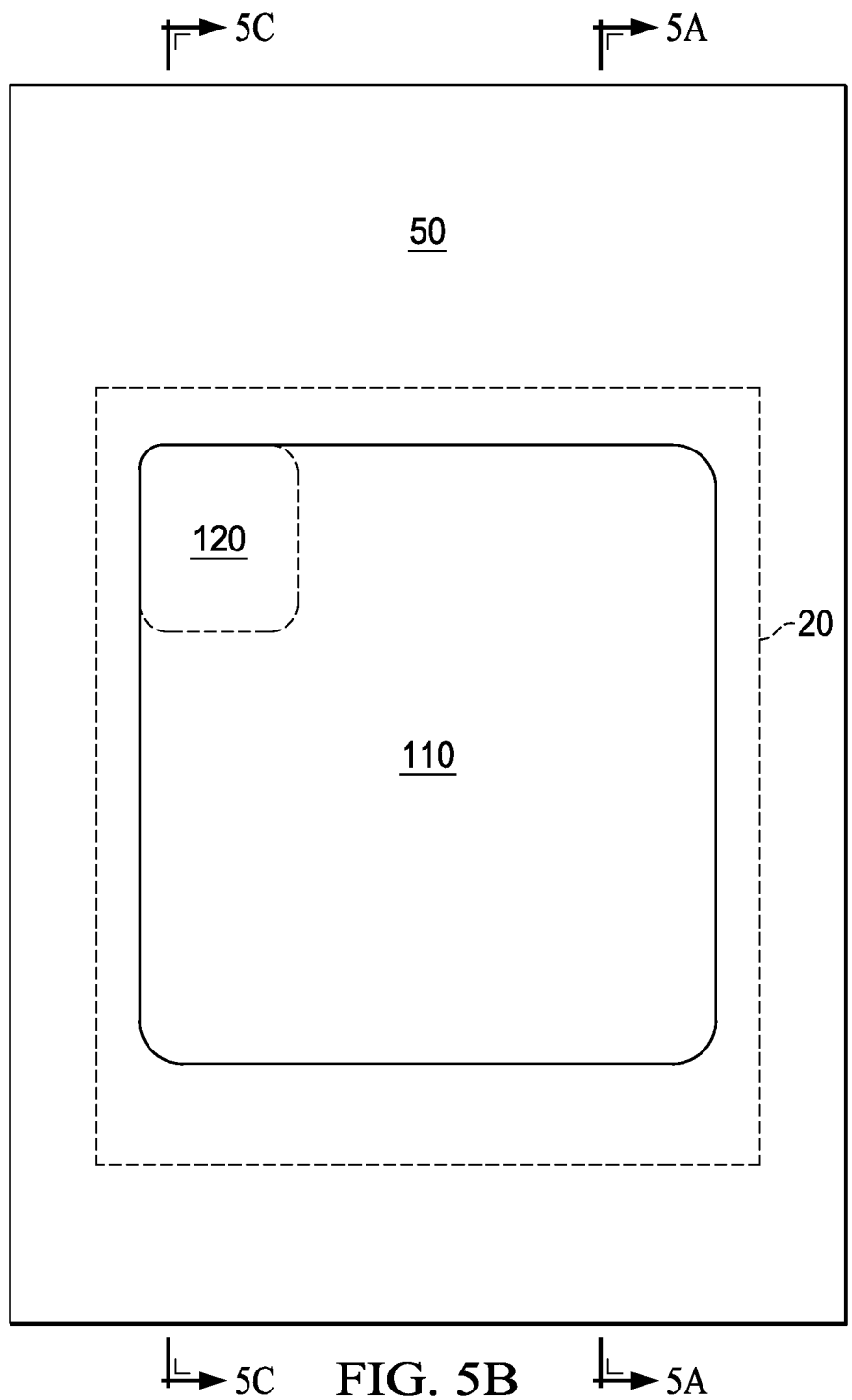

FIG. 5, which includes FIGS. 5A-5C, illustrates a magnified view of the semiconductor package during fabrication showing front side metallization in accordance with an embodiment of the invention, wherein FIGS. 5A and 5C illustrate cross-sectional views and FIG. 5B illustrates a top sectional view. Unlike FIGS. 2-4, FIG. 5 illustrates a magnified view of a single semiconductor package.

Referring to FIGS. 5A through 5C, the vertical semiconductor chip 20 includes a front side metallization layer 100 comprising a source contact region 110 and a gate contact region 120 (see also FIG. 5B). The front side metallization layer 100 is formed over the top surface 11 of the vertical semiconductor chip 20. In various embodiments, the front side metallization layer 100 may be formed previously prior to chip dicing. Alternatively, in some embodiments, the front side metallization layer 100 may be formed at this stage of processing. The source contact region 110 and the gate contact region 120 may comprise a plurality of layers. In one embodiment, silicide regions may cover a semiconductor material of the vertical semiconductor chip 20. A barrier layer may be formed over the silicide regions followed by a metal layer. In one embodiment, the source contact region 110 and the gate contact region 120 may comprise copper. In another embodiment, the source contact region 110 and the gate contact region 120 may comprise aluminum. In various embodiments, the source contact region 110 and the gate contact region 120 may comprise titanium, tantalum, tungsten, and nitrides thereof. A passivation layer 60 is disposed around the front side metallization layer 100.

Figure 6B:
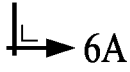

FIG. 6, which includes FIGS. 6A and 6B, illustrates a magnified view of the semiconductor package, during fabrication, after formation of redistribution layer in accordance with an embodiment of the invention, wherein FIG. 6A illustrates a cross-sectional view and FIG. 6B illustrates a top sectional view.

Referring to FIG. 6A, a redistribution layer 200 is formed over the front side metallization layer 100. The redistribution layer 200 includes a source contact 210, a source pad 230, a gate contact 220, a gate pad 240, and a plurality of conductive lines 250. The redistribution layer 200 may be formed using any suitable technique. In one embodiment, a seed layer may be deposited over the top surface of the reconstituted wafer 90. A resist layer may be deposited over the seed layer and patterned to expose portions of the seed layer. A conductive material may be grown using the seed layer, for example, using plating processes such as electroplating or electroless plating. In one embodiment, the grown conductive material comprises copper, silver, gold, nickel, zinc, and/or platinum. In an alternative embodiment, a conductive material may be deposited and patterned using a subtractive etch process. In a further embodiment, the redistribution layer 200 may be printed directly, for example, using stencil printing or screen printing.

Figure 7B:
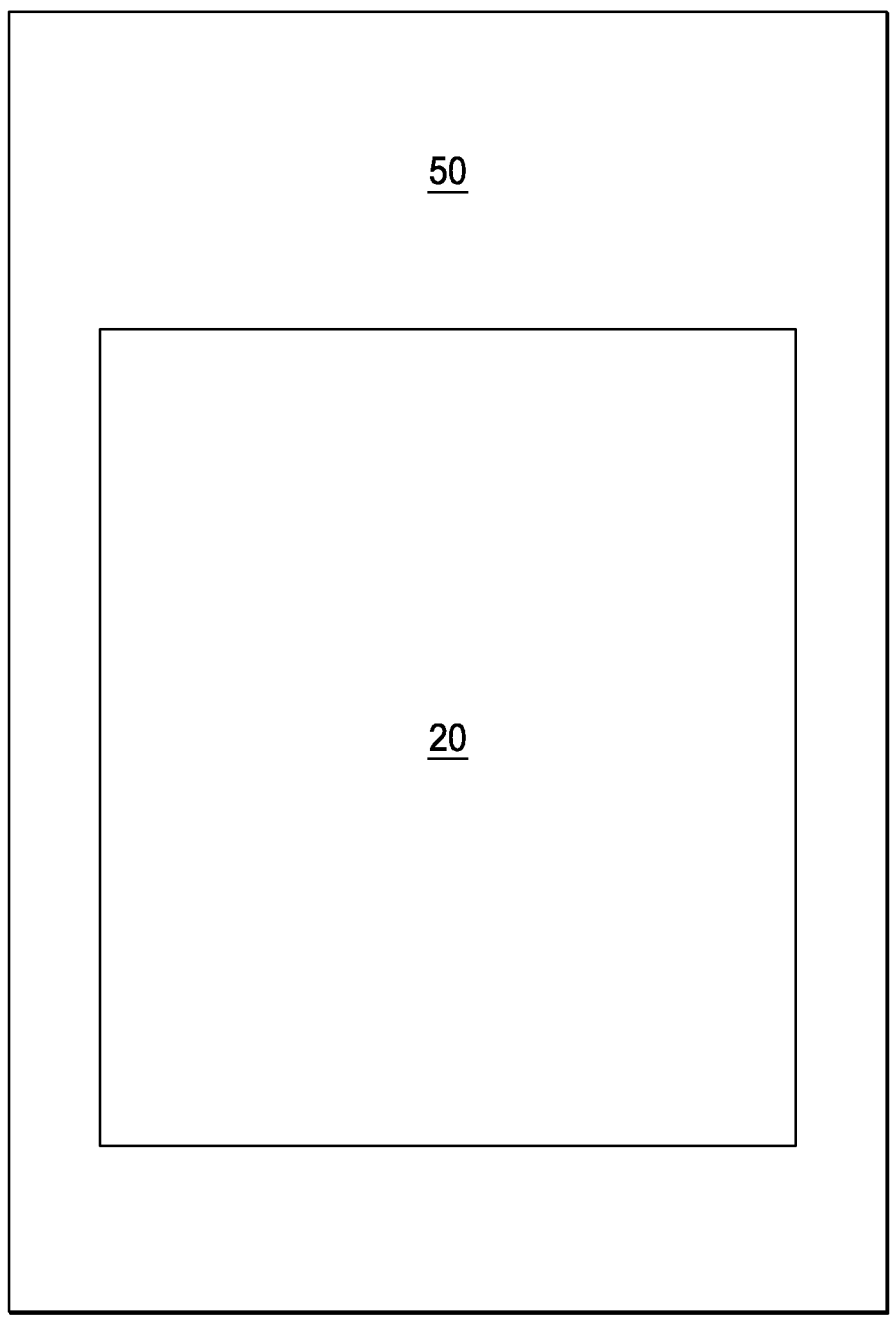

FIG. 7, which includes FIGS. 7A and 7B, illustrates a magnified view of the semiconductor package during fabrication after thinning the reconstituted wafer in accordance with an embodiment of the invention, wherein FIG. 7A illustrates a cross-sectional view and FIG. 7B illustrates a top sectional view.

The reconstituted wafer 90 is thinned from the back surface to expose a surface of the vertical semiconductor chip 20. In various embodiments, the thinning may be performed chemical, mechanically, or chemical mechanically. In one embodiment, a grinding tool 40 may be used to thin the reconstituted wafer 90. After thinning, the reconstituted wafer 90 has a first height H1. In various embodiments, the first height H1 may be about 50 μm to about 500 μm. In one embodiment, the first height H1 may be about 10 μm to about 50 μm. In one embodiment, the first height H1 may be about 10 μm to about 100 μm. In one embodiment, the first height H1 may be about 100 μm to about 400 μm. In one embodiment, the first height H1 may be less than about 50 μm. In one embodiment, the first height H1 may be less than about 100 μm. In one embodiment, the first height H1 may be less than about 200 μm. In one embodiment, the first height H1 may be less than about 500 μm.

Figure 8B:
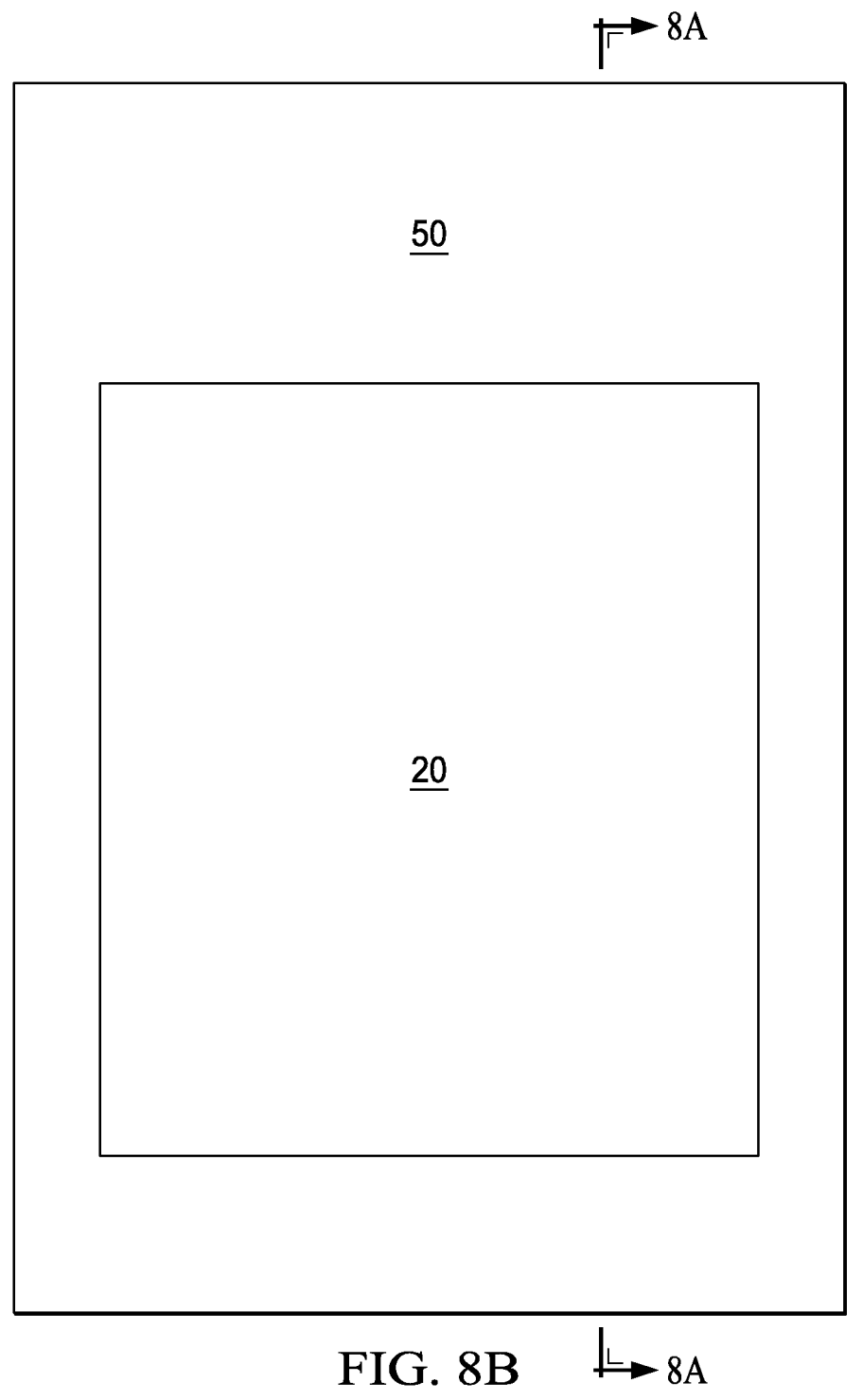

FIG. 8, which includes FIGS. 8A-8C, illustrates a magnified view of the semiconductor package during fabrication after further thinning the vertical semiconductor chip in accordance with an embodiment of the invention, wherein FIG. 8A illustrates a cross-sectional view and FIG. 8B illustrates a top sectional view, and wherein FIG. 8C illustrates an alternative embodiment showing a further magnified cross-sectional view.

The exposed back surface of the vertical semiconductor chip 20 is thinned to a second height H2 forming a trench 310. The trench 310 may include sidewalls in various embodiments (one such embodiment is illustrated in FIG. 11).

In various embodiments, the second height H2 may be about 0.5 μm to about 10 μm. In one embodiment, the second height H2 may be about 0.5 μm to about 2 μm. In one embodiment, the second height H2 may be about 1 μm to about 2 μm. In one embodiment, the second height H2 may be about 2 μm to about 5 μm. In one embodiment, the second height H2 may be about 3 μm to about 4 μm.

Advantageously, the vertical semiconductor chip 20 is thinned down to a very small thickness in various embodiments. This advantageously reduces the resistance of the device during operation as well as improves the thermal conduction of heat away from the device.

In one embodiment, an etching process is used to selectively etch the vertical semiconductor chip 20 relative to the encapsulant 50. The etching process may be a timed etch in one embodiment. In another embodiment, the etching chemistry is selected to stop (slow down) after reaching the doped regions of the vertical semiconductor chip 20.

In another embodiment, a etch stop layer is used to stop the etching process. In some embodiments, as illustrated in FIG. 8C, the structure of the substrate comprising the vertical semiconductor chip 20 may be changed during the thinning process. FIG. 8C illustrates the thickness of a vertical semiconductor chip 20 before and after thinning. The vertical semiconductor chip 20 prior to thinning comprises a first layer 31 comprising the active region and a second layer 32 comprising a different material than the first layer 31. In one embodiment, the first layer 31 comprises silicon and the second layer 32 comprises an oxide layer when the vertical semiconductor chip 20 is being fabricated on a silicon on insulator substrate. In another embodiment, the first layer 31 comprises a compound semiconductor material such as GaN and the second layer 32 comprises silicon when the vertical semiconductor chip 20 is being fabricated on a GaN/Si heteroepitaxial substrate. The thickness of the vertical semiconductor chip 20 prior to thinning is the first thickness H1 while after the thinning is the second thickness H2. For example, when the vertical semiconductor chip 20 is formed on a silicon on insulator substrate, the thinning process may be stopped after removing the insulator layer. Similarly, in case of a hetero-epitaxial substrate, such as a GaN layer on a silicon substrate, the thinning process may be stopped after removing the silicon substrate leaving the GaN layer. Alternatively, a small portion of the silicon substrate may be left, which may be converted to a silicide subsequently. For example, this may be used to form vertical GaN power devices (or SiC power devices).

Figure 9A:
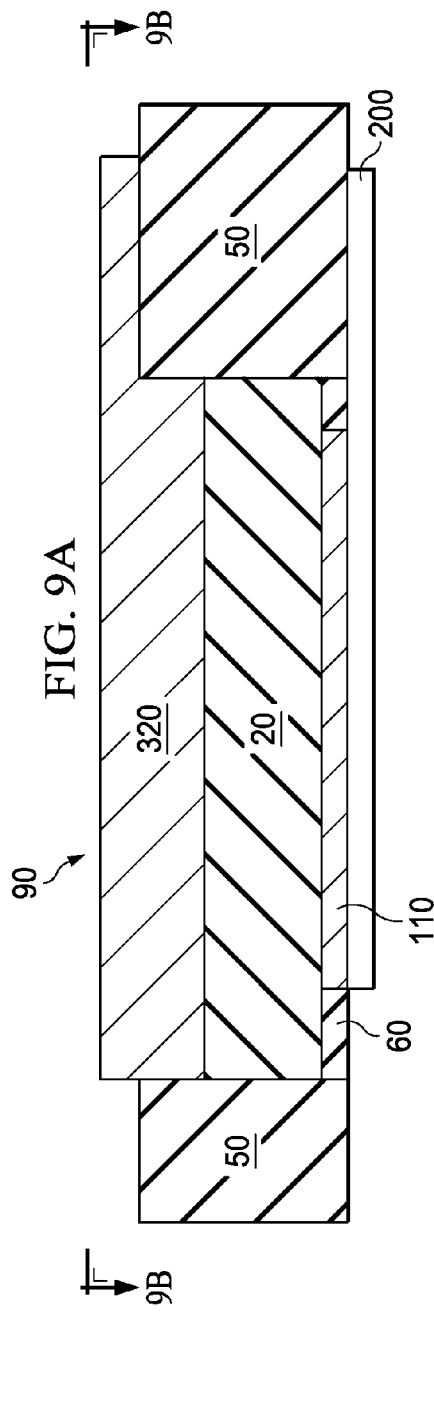
Figure 9B:
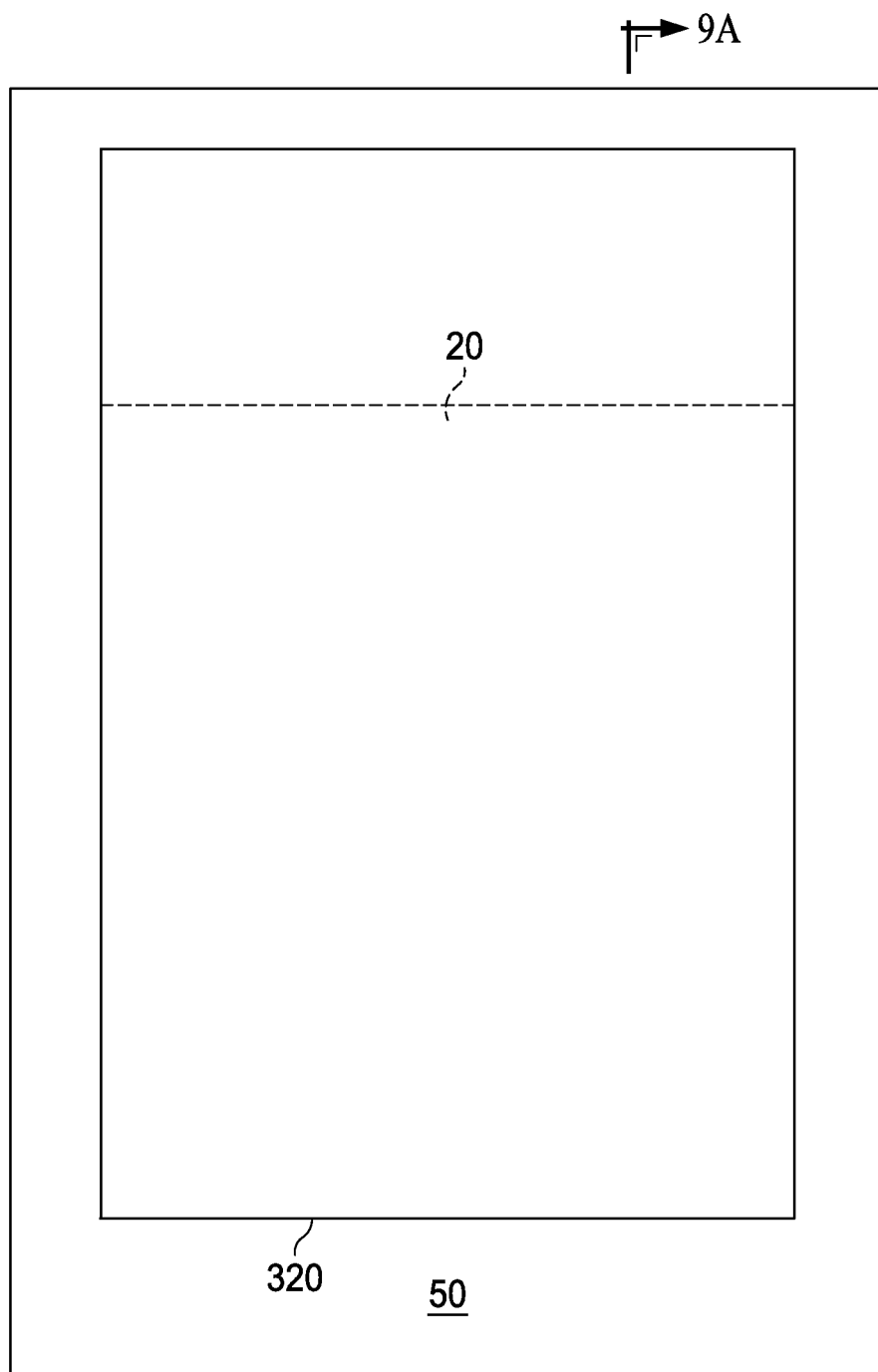

FIG. 9, which includes FIGS. 9A and 9B, illustrates a magnified view of the semiconductor package during fabrication after forming a back side conductor under the vertical semiconductor chip in accordance with an embodiment of the invention, wherein FIG. 9A illustrates a cross-sectional view and FIG. 9B illustrates a top sectional view.

Referring to FIG. 9A, a back side contact 320 is formed under the exposed back surface of the vertical semiconductor chip 20. Thus, in one embodiment, the back side contact 320 forms part of the drain contact of the transistor in the vertical semiconductor chip 20.

Similar to the front side redistribution layer 200, the back side contact 320 may be formed using any suitable technique. In one embodiment, a seed layer may be deposited over the back surface of the reconstituted wafer 90. A resist layer may be deposited over the seed layer and patterned to expose portions of the seed layer. A conductive material may be grown using the seed layer, for example, using plating processes such as electroplating or electroless plating. In one embodiment, the grown conductive material comprises copper, silver, gold, nickel, zinc, and/or platinum. In an alternative embodiment, a conductive material may be deposited and patterned using a subtractive etch process. In a further embodiment, the redistribution layer 200 may be printed directly, for example, using stencil printing or screen printing.

The reconstituted wafer 90 is diced to form individual package units after forming the back side contact 320.

Advantageously, in various embodiments, the back side contact 320 is a thick conductive layer, which is formed under the vertical semiconductor chip 20. The conductive material filling the trenches 310 of the reconstituted wafer 90 ensures good thermal conduction away from the semiconductor regions.

The semiconductor package thus formed may be used directly and mounted on a circuit board in some embodiments. In other embodiments, the semiconductor package may be packaged over a lead frame, clip frame, and other suitable substrates, to form a semiconductor package. Embodiments of the invention include forming any suitable type of packages, for example, compatible with JEDEC standards. Examples include transistor outline packages, small outline packages, thin small outline packages, thin shrink small outline packages, single in line packages, and others.

The semiconductor package thus being formed may be tested prior to subsequent packaging. For example, a test probe may be applied over the pads (e.g., the source pad 230 and the gate pad 240). However, in various embodiments, the vertical semiconductor chip 20 is very thin and may be damaged if directly pressed down by the test probe, i.e., when pressure is applied directly above the thin semiconductor layer. In various embodiments, advantageously, damage to the thinned vertical semiconductor chip 20 is avoided due to the fan-out nature of these pads. In others words, the pads are mechanically supported by the encapsulant 50 and placing a test probe does not damage the vertical semiconductor chip 20. Further, the design does not require an increase in the chip area.

Figure 10A:
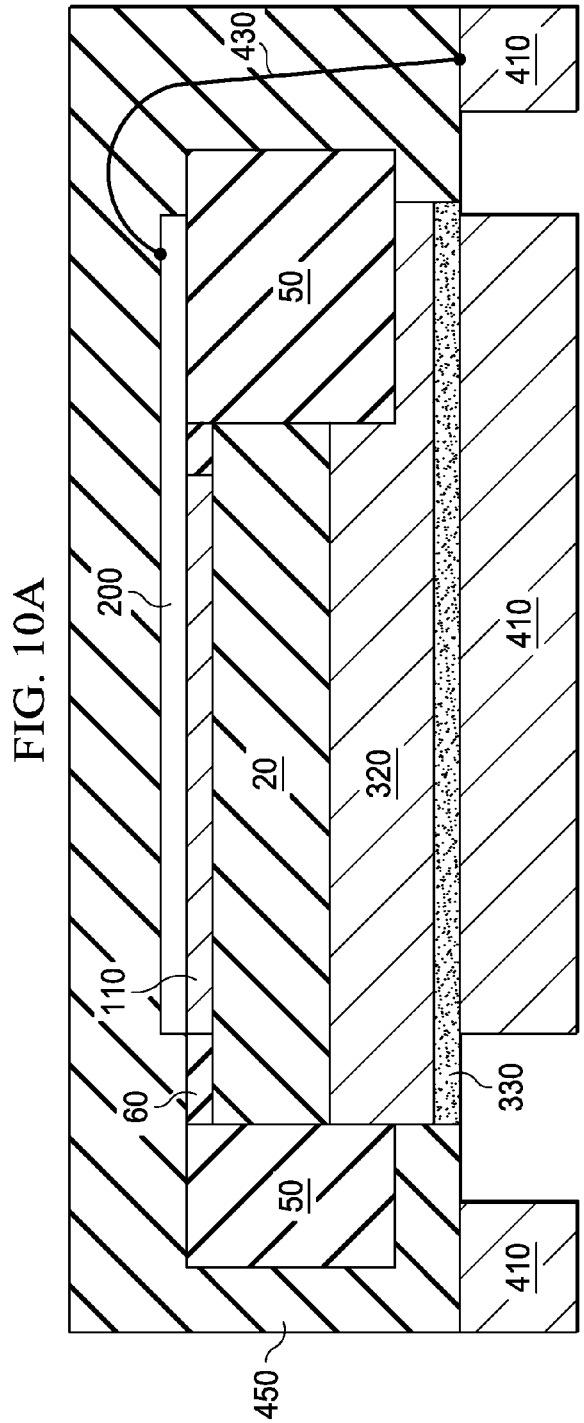

FIG. 10, which includes FIGS. 10A and 10B, illustrates leadframe semiconductor packages formed in accordance with embodiments of the invention.

Referring to FIG. 10A, a semiconductor package, for example, as formed in FIG. 9, is placed over a lead frame 410. The semiconductor package may be attached to the lead frame 410 using an adhesive layer 330, which may be insulating in one embodiment. In some embodiments, the adhesive layer 330 may be conductive, for example, may comprise a nano-conductive paste. In alternative embodiments, the back side contact 320 may be soldered to the lead frame 410 so that the adhesive layer 330 is a solderable material. The pads (e.g., the source pad 230 and the gate pad 240) are coupled to the lead frame 410 using wire bonds 430 using a wire bonding process. An outer encapsulant 450 is applied over the semiconductor package and the lead frame 410.

In one or more embodiments, the outer encapsulant 450 may be applied using a compression molding process. In compression molding, the outer encapsulant 450 may be placed into a molding cavity, then the molding cavity is closed to compress the outer encapsulant 450. Compression molding may be used when a single pattern is being molded. In an alternative embodiment, the outer encapsulant 450 may be applied using a transfer molding process. In other embodiments, the outer encapsulant 450 may be applied using injection molding, granulate molding, powder molding, or liquid molding. Alternatively, the outer encapsulant 450 may be applied using printing processes such as stencil or screen printing. A curing process may be performed to form a lead frame package.

FIG. 10B illustrates an alternative embodiment displaying a clamp like interconnect. The clamp 440 or metal strips may be attached to an intermediate layer 265, for example, using soldering. Embodiments of the invention include other types of suitable interconnects.

FIGS. 11-12 illustrate an alternative structural embodiment of a semiconductor package and a method of forming.

This embodiment may follow the steps described in FIGS. 2-7. Referring to FIG. 11, the trench 310 may be formed as described in prior embodiment. As a further illustration, in one embodiment, the trench 310 may include a trapezoidal sidewall, which has a concave surface.

Referring to FIG. 12, an adhesive paste 321 is applied over the exposed surface of the vertical semiconductor chip 20. A back plate 325 is placed over the adhesive paste 321. The adhesive paste 321 may be cured thereby holding the back plate 325 securely. This embodiment avoids the potentially long electroplating process for forming the thick back side redistribution layer.

FIG. 13, which includes FIGS. 13A-13E, illustrates an alternative embodiment in which the front and back side redistribution layers are formed after the thinning process.

This embodiment may follow the steps described in FIGS. 2-7. As illustrated in FIG. 13A, after forming the trenches 310 on the back side of the vertical semiconductor chip 20, a front side redistribution layer 200 is formed. The reconstituted wafer 90 (illustrated in FIG. 7) is singulated either prior to or after forming the trenches 310 in various embodiments. The front side redistribution layer 200 is also formed on the sidewalls of the package thereby obviating the need to form interconnects such as wire bonds separately. For example, metal may be sputtered along sidewalls to form the interconnect 280.

Referring to FIG. 13B, an adhesive paste 321 is formed on the back side of the vertical semiconductor chip 20 as described in the prior embodiment. As shown in FIG. 13C, a back plate 325 is formed over the adhesive paste 321 as described previously. Referring to FIG. 13D, the semiconductor package is placed over a lead frame 410 having a plurality of leads 420. Thus, the interconnects 280 from the semiconductor package are coupled to the plurality of leads 420 using an adhesive layer 330. In one embodiment, the adhesive layer 330 comprises a solder material. In other embodiments, the adhesive layer 330 may comprise a conductive paste.

Referring to FIG. 13E, an outer encapsulant 450 is formed over the semiconductor package and the lead frame 410. Thus, in various embodiments, a lead frame package is formed.

Figure 14A:
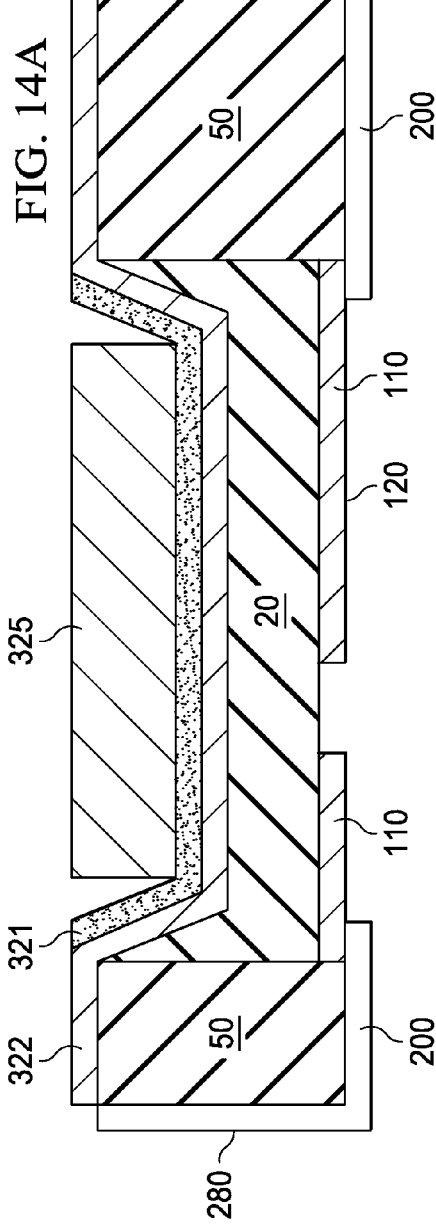
FIGS. 14A and 14B, illustrates an alternative embodiment of fabricating the semiconductor package wherein a metal liner is formed prior to forming the back side conductor.
Figure 14B:
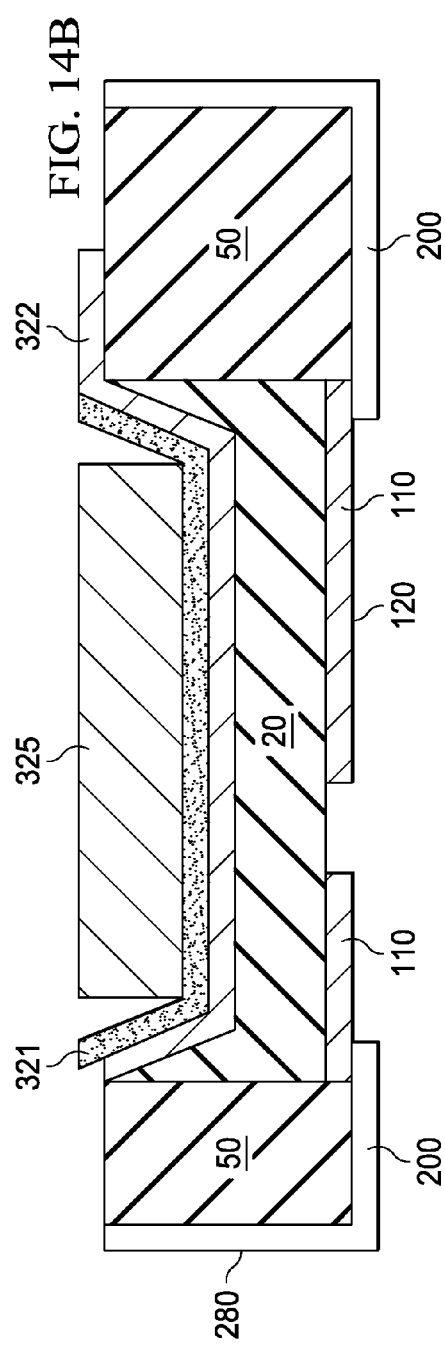

FIG. 14, which includes FIGS. 14A and 14B, illustrates an alternative embodiment of fabricating the semiconductor package wherein a metal liner is formed prior to forming the back plate.

This embodiment is similar to FIG. 13. However, as illustrated in FIG. 14A, prior to forming the adhesive paste 321, a metal liner 322 is formed on the back surface of the singulated reconstituted wafer. The metal liner 322 may be used as a seed layer and may be used to form redistribution lines subsequently (e.g., as shown in FIG. 14B).

Figure 15:
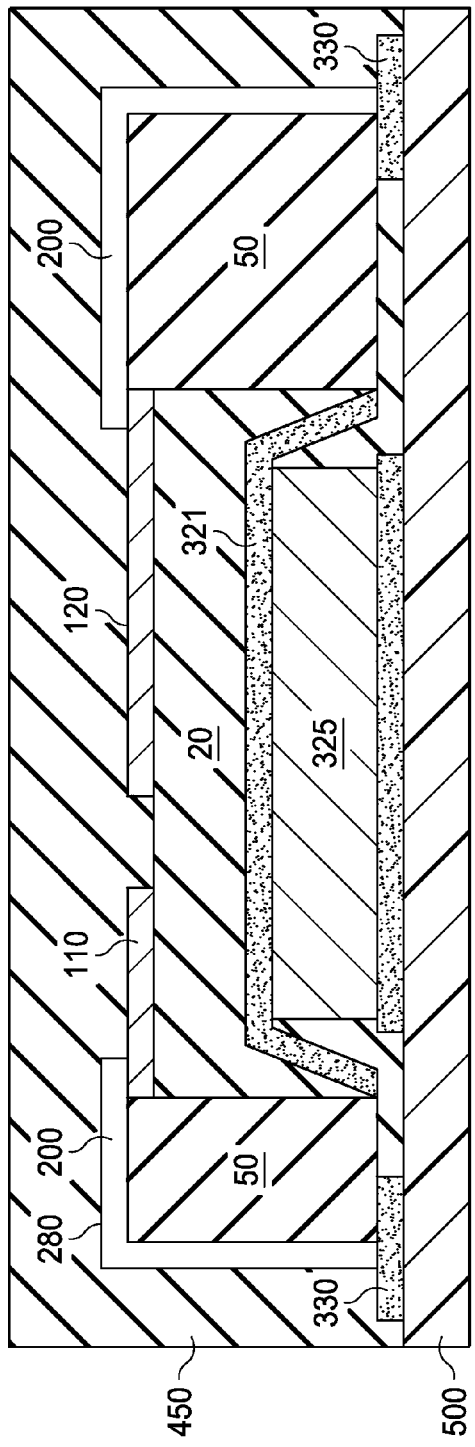
FIG. 15 illustrates mounting the semiconductor package on a circuit board in accordance with an alternative embodiment of the invention.

FIG. 15 illustrates an alternative embodiment of the invention showing mounting the semiconductor package directly on a circuit board. In one embodiment, instead of attaching the semiconductor package to a lead frame 410, the semiconductor package with the encapsulant 50 is placed over a carrier and encapsulated with an outer encapsulant 450 as described in prior embodiments. The package thus formed is separated from the carrier and may be mounted on a circuit board 500.

So far embodiments of the invention were described using a single discrete transistor. However, embodiments of the invention may be applied to form a plurality of transistors. A few examples are provided in FIGS. 16 and 17.

Figure 16A:
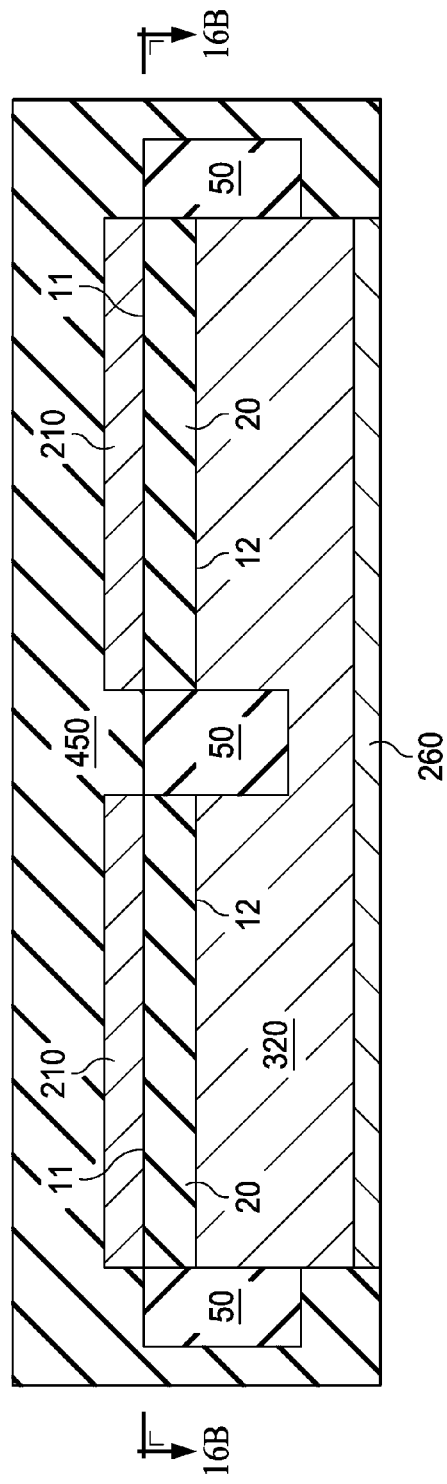

FIG. 16, which includes FIGS. 16A and 16B, illustrates a semiconductor package having more than one vertical semiconductor device in accordance with an embodiment of the invention.

As illustrated in FIGS. 16A and 16B, two discrete transistors are embedded adjacent each other. The two transistors may be interconnected as needed. Embodiments of the invention may include more than two transistors. For example, in FIG. 16A, a drain of the first transistor (left transistor) is coupled to a source of a second transistor (right transistor). In this embodiment, at least two discrete vertical semiconductor chips 20 are placed adjacent each other while forming the reconstituted wafer and are therefore embedded within the encapsulant 50.

Figure 17A:
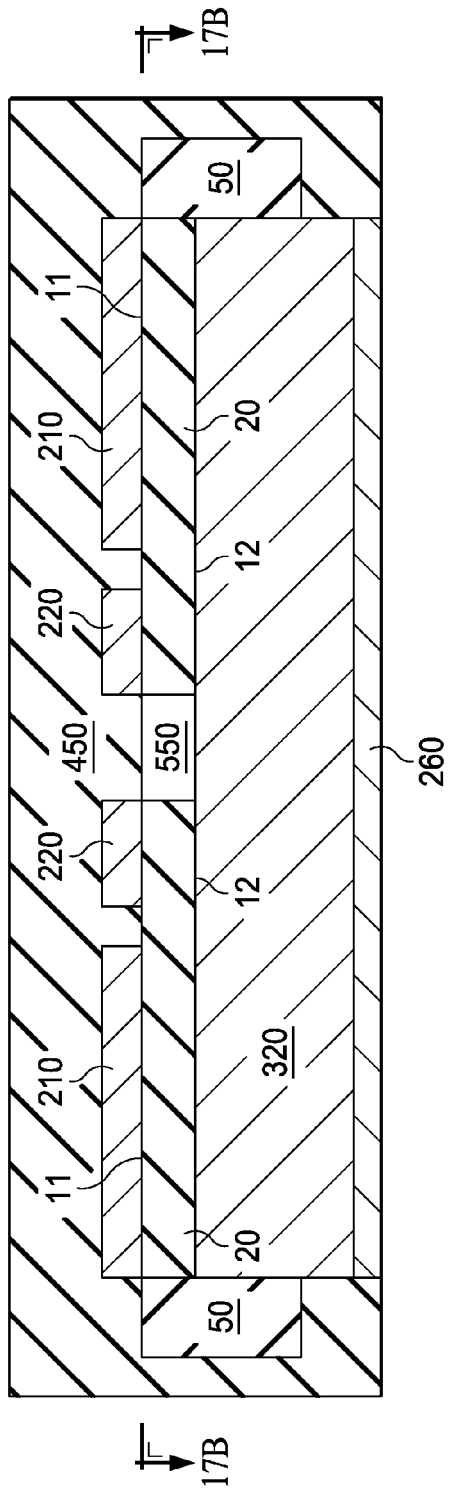
FIGS. 17A and 17B, illustrates a semiconductor package having more than one transistor in a single chip in accordance with an embodiment of the invention.
Figure 17B:
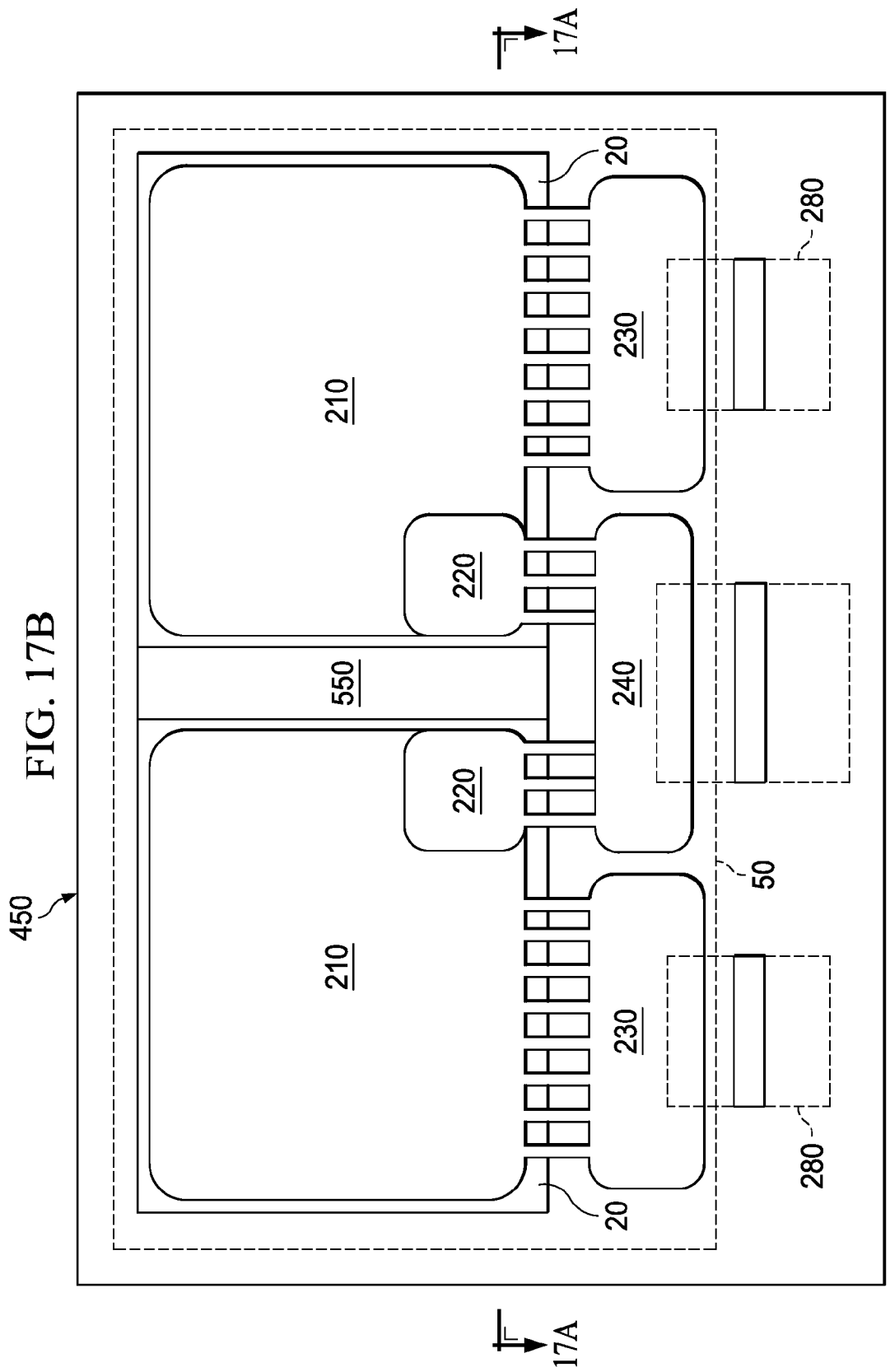

FIG. 17, which includes FIGS. 17A and 17B, illustrates a semiconductor package having more than one transistor in a single chip in accordance with an embodiment of the invention.

Unlike the prior embodiment, in this embodiment, the vertical semiconductor chips 20 are formed within the same substrate. After the thinning process, the adjacent transistors are separated by only the isolation regions 550. Thus multiple power devices may be integrated into a single package inexpensively. Again, the transistors may be interconnected as needed. For example, the gate pads 240 of the adjacent transistors may be coupled together while the drain of the left transistor is coupled to the source of the second transistor through the back side contact 320. In various embodiments, FIGS. 10-14 may also similarly be applied accommodating multiple transistors and/or chips.

Figure 18:
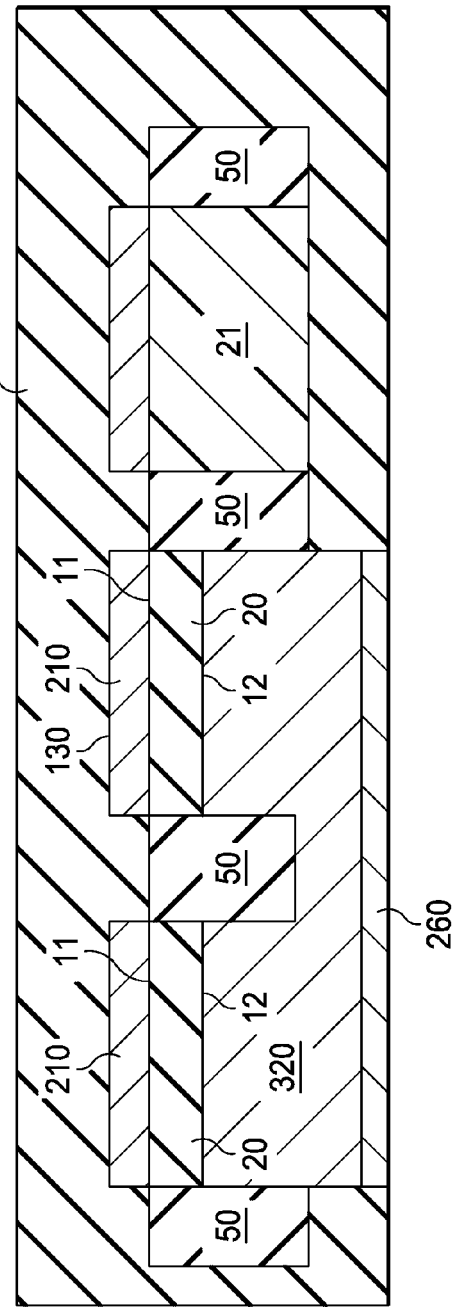
FIG. 18 illustrates a semiconductor package having more than one vertical semiconductor device and a logic circuit in accordance with an embodiment of the invention.

FIG. 18 illustrates a semiconductor package having more than one vertical semiconductor device and a logic circuit in accordance with an embodiment of the invention.

As illustrated in FIG. 18, two discrete transistors are embedded adjacent each other. The two transistors may be interconnected as needed. Embodiments of the invention may include more than two transistors. For example, in FIG. 18, a drain of the first transistor (left transistor) is coupled to a source of a second transistor (right transistor). In this embodiment, at least two discrete vertical semiconductor chips 20 and a logic chip 21 are placed adjacent each other while forming the reconstituted wafer and are therefore embedded within the encapsulant 50.

Embodiments of the present invention offer may advantages over conventional packaging of vertical power semiconductor devices. Advantageously, embodiments of the invention do not require handling ultra-thin wafers while at the same producing ultra-thin chips. Similarly, embodiments of the invention do not require cutting, soldering of thin semiconductor chips. Embodiments of the invention allow backside processing to high temperatures facilitating formation of other layers, for example, up to 280° C. Embodiments of the invention may be applied regardless of the frontend technology, for example, SFET, IGBTs, SiC, CMOS, bipolar, etc. Embodiments of the invention may be processed as large wafers or panels. Embodiments of the invention enable higher yield due to good testing and the robust assembly process. Embodiments of the invention enable improved thermal cooling and enable double sided cooling. Embodiments of the invention improve contact formation, for example, the back side bonding area may be larger than chip size.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-18 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package comprising:
   a vertical semiconductor chip having a first major surface on one side of the vertical semiconductor chip and a second major surface on an opposite side of the vertical semiconductor chip, wherein the first major surface includes a first contact region and the second major surface includes a second contact region, and wherein the vertical semiconductor chip is configured to regulate flow of current from the first contact region to the second contact region along a current flow direction;
   a front side conductor disposed over the first contact region;
   a back side conductor disposed at the second contact region of the second major surface and covering the second major surface; and
   a first encapsulant in which the vertical semiconductor chip and the back side conductor are disposed, the first encapsulant disposed along a sidewall of the semiconductor chip in a direction of current flow, wherein the first encapsulant covers a first portion of sidewalls of the back side conductor; and
   a second encapsulant covering outer sidewalls of the first encapsulant, the front side conductor, and remaining portions of the sidewalls of the back side conductor.

2. The semiconductor package according to claim 1, wherein the first encapsulant, the vertical semiconductor chip, and the back side conductor are disposed in the second encapsulant.

3. The semiconductor package according to claim 2, further comprising:
   a plurality of contact pads disposed in a major surface of the second encapsulant.

4. The semiconductor package according to claim 3, wherein the plurality of contact pads comprise a first contact pad coupled to the first contact region through an interconnect disposed in the second encapsulant.

5. The semiconductor package according to claim 4, wherein the interconnect is one or more of a wire bond, a clamp, clip, strip, ribbon, and a galvanic interconnect.

6. The semiconductor package according to claim 4, wherein the interconnect is disposed on a sidewall of the first encapsulant.

7. The semiconductor package according to claim 6, wherein the interconnect is disposed between the first encapsulant and the second encapsulant.

8. The semiconductor package according to claim 2, wherein the first encapsulant and the second encapsulant are the same material.

9. The semiconductor package according to claim 2, wherein the first encapsulant and the second encapsulant are different materials.

10. The semiconductor package according to claim 1, wherein the back side conductor is attached to the vertical semiconductor chip by an adhesive paste, film, or tape.

11. The semiconductor package according to claim 1, wherein a thickness of the vertical semiconductor chip along the current flow direction is less than about 50 µm.

12. The semiconductor package according to claim 1, wherein a thickness of the vertical semiconductor chip along the current flow direction is about 5 µm to about 25 µm.

13. The semiconductor package according to claim 1, wherein the vertical semiconductor chip comprises:
 a first transistor having the first contact region and the second contact region, and
 a second transistor having a third contact region on the first major surface and a fourth contact region on the second major surface, wherein the second transistor is configured to regulate flow of current from the third contact region to the fourth contact region, and wherein the first transistor is separated from the second transistor by an isolation region.

14. The semiconductor package according to claim 1, wherein the vertical semiconductor chip comprises a silicon substrate.

15. The semiconductor package according to claim 1, wherein the vertical semiconductor chip comprises gallium nitride.

16. The semiconductor package according to claim 1, wherein the vertical semiconductor chip comprises silicon carbide.

17. A semiconductor package comprising:
 a vertical semiconductor chip having a first major surface on one side of the vertical semiconductor chip and a second major surface on an opposite side of the vertical semiconductor chip, wherein the first major surface includes a first contact region and the second major surface includes a second contact region, and wherein the vertical semiconductor chip is configured to regulate flow of current from the first contact region to the second contact region along a current flow direction;
 a back side conductor disposed on a drain contact region of the second major surface;
 a first encapsulant in which the vertical semiconductor chip and the back side conductor are disposed, wherein the first encapsulant covers a first portion of sidewalls of the back side conductor;
 a second encapsulant surrounding an outer sidewall of the first encapsulant in which the first encapsulant, the vertical semiconductor chip, and the back side conductor are disposed, wherein the second encapsulant covers a remaining portion of the sidewalls of the back side conductor;
 a plurality of contact pads disposed on a major surface of the second encapsulant; and
 an interconnect disposed in the second encapsulant, the interconnect coupling the first contact region with a pad of the plurality of contact pads.

18. The semiconductor package according to claim 17, wherein the vertical semiconductor chip comprises:
 a first transistor having the first contact region and the second contact region, and
 a second transistor having a third contact region on the first major surface and a fourth contact region on the second major surface, wherein the second transistor is configured to regulate flow of current from the third contact region to the fourth contact region, and wherein the first transistor is separated from the second transistor by an isolation region.

19. The semiconductor package according to claim 17, wherein the vertical semiconductor chip has a slanted sidewall.

20. The semiconductor package according to claim 17, wherein the vertical semiconductor chip is thinner than the first encapsulant along the current flow direction.

21. The semiconductor package according to claim 17, wherein a thickness of the vertical semiconductor chip along the current flow direction is less than about 50 µm.

22. The semiconductor package according to claim 17, wherein a thickness of the vertical semiconductor chip along the current flow direction is about 1 µm to about 100 µm.

23. The semiconductor package according to claim 17, wherein the interconnect is disposed on a sidewall of the first encapsulant.

24. The semiconductor package according to claim 23, wherein the interconnection is disposed between the first encapsulant and the second encapsulant.

25. The semiconductor package according to claim 1, further comprising:
 a second vertical semiconductor chip disposed in the first encapsulant, the second vertical semiconductor chip coupled to the vertical semiconductor chip; and
 a logic chip disposed in the first encapsulant.

26. The semiconductor package according to claim 10, wherein the adhesive paste is deposited over a slanted sidewall of the vertical semiconductor chip.

27. The semiconductor package according to claim 1, further comprising:
 a second vertical semiconductor chip disposed in the first encapsulant, wherein the second vertical semiconductor chip has a first major surface on one side of the second vertical semiconductor chip and a second major surface on an opposite side of the second vertical semiconductor chip.

28. The semiconductor package according to claim 17, further comprising:
 a second vertical semiconductor chip disposed in the first encapsulant, wherein the second vertical semiconductor chip has a first major surface on one side of the second vertical semiconductor chip and a second major surface on opposite side of the second vertical semiconductor chip.

29. The semiconductor package according to claim 28, further comprising a logic chip disposed in the first encapsulant.

30. The semiconductor package according to claim 1, further comprising a die paddle and an adhesive layer disposed between the back side conductor and the die paddle.

* * * * *